(12) United States Patent
Kim et al.

(10) Patent No.: US 11,828,807 B2
(45) Date of Patent: Nov. 28, 2023

(54) METHOD AND APPARATUS WITH BATTERY STATE ESTIMATION

(71) Applicant: Samsung Electronics Co., Ltd., Suwon-si (KR)

(72) Inventors: Jinho Kim, Yongin-si (KR); Tae Won Song, Yongin-si (KR); Young Hun Sung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 143 days.

(21) Appl. No.: 17/328,246

(22) Filed: May 24, 2021

(65) Prior Publication Data

US 2022/0065934 A1 Mar. 3, 2022

(30) Foreign Application Priority Data

Sep. 1, 2020 (KR) .......................... 10-2020-0111026

(51) Int. Cl.
*G01R 31/367* (2019.01)
*G01R 31/3835* (2019.01)
*H02J 7/00* (2006.01)

(52) U.S. Cl.
CPC ....... *G01R 31/367* (2019.01); *G01R 31/3835* (2019.01); *H02J 7/0048* (2020.01)

(58) Field of Classification Search
None
See application file for complete search history.

(56) References Cited

U.S. PATENT DOCUMENTS

| 6,275,008 B1 * | 8/2001 | Arai | G01R 31/3842 320/132 |
| 6,310,462 B1 * | 10/2001 | Arai | G01R 31/3842 320/132 |

(Continued)

FOREIGN PATENT DOCUMENTS

| JP | 2014-10005 A | 1/2014 |
| KR | 10-2013-0066283 A | 6/2013 |

(Continued)

OTHER PUBLICATIONS

Extended European Search Report dated Dec. 16, 2021 in counterpart European Patent Application No. 21185286.8 (5 pages in English).

(Continued)

*Primary Examiner* — Brent A. Fairbanks
(74) *Attorney, Agent, or Firm* — NSIP Law

(57) ABSTRACT

A processor-implemented method with battery state estimation includes estimating a current state of charge (SOC) of a target battery by correcting a first electrochemical model corresponding to the target battery using a first voltage difference between a measured voltage of the target battery and an estimated voltage of the target battery that is estimated by the first electrochemical model, estimating an end SOC of the target battery by correcting a second electrochemical model using a second voltage difference between an estimated voltage of a virtual battery that is estimated by the second electrochemical model and a preset voltage, and estimating a relative SOC (RSOC) of the target battery based on the current SOC and the end SOC of the target battery, wherein the second electrochemical model is based on the virtual battery corresponding to the target battery being discharged to reach the preset voltage.

20 Claims, 26 Drawing Sheets

(56) References Cited

U.S. PATENT DOCUMENTS

| | | | |
|---|---|---|---|
| 6,789,026 B2 | 9/2004 | Barsoukov et al. | |
| 6,832,171 B2 | 12/2004 | Barsoukov et al. | |
| 6,892,148 B2 | 5/2005 | Barsoukov et al. | |
| 8,154,252 B2 | 4/2012 | Lu et al. | |
| 8,198,863 B1 | 6/2012 | Wortham | |
| 8,207,740 B2 | 6/2012 | Lin et al. | |
| 8,507,121 B2 | 8/2013 | Saito et al. | |
| 8,754,611 B2 | 6/2014 | Greening et al. | |
| 8,846,233 B2 | 9/2014 | Lee et al. | |
| 9,236,748 B2 | 1/2016 | Barsukov et al. | |
| 9,660,462 B2 | 5/2017 | Jeon | |
| 9,787,118 B2 | 10/2017 | Wortham | |
| 9,895,991 B2 | 2/2018 | Kim et al. | |
| 9,979,211 B2 | 5/2018 | Barsukov et al. | |
| 10,003,106 B2 | 6/2018 | Jeon et al. | |
| 10,338,147 B2 | 7/2019 | Nishiyama | |
| 10,520,553 B2 | 12/2019 | Nishiyama | |
| 10,536,018 B2 | 1/2020 | Jung | |
| 10,557,890 B2 | 2/2020 | Li et al. | |
| 2006/0238167 A1* | 10/2006 | Arai | G01R 31/3647 320/132 |
| 2010/0085057 A1* | 4/2010 | Nishi | G01R 31/3842 324/427 |
| 2011/0234167 A1 | 9/2011 | Kao et al. | |
| 2015/0081237 A1 | 3/2015 | Ye et al. | |
| 2017/0059662 A1* | 3/2017 | Cha | H01M 10/4285 |
| 2018/0120383 A1* | 5/2018 | Nishiyama | G01R 31/367 |
| 2018/0143254 A1* | 5/2018 | Kim | G01R 31/367 |
| 2019/0115769 A1 | 4/2019 | Chen et al. | |
| 2020/0103468 A1* | 4/2020 | Watanabe | G01R 31/374 |
| 2020/0136212 A1 | 4/2020 | Jung et al. | |
| 2020/0227791 A1 | 7/2020 | Flueckiger et al. | |
| 2021/0013731 A1* | 1/2021 | Choe | H02J 7/007194 |
| 2021/0270906 A1* | 9/2021 | Chou | G01R 31/367 |

FOREIGN PATENT DOCUMENTS

| | | |
|---|---|---|
| KR | 10-2040880 61 | 11/2019 |
| KR | 10-2049164 61 | 11/2019 |
| KR | 10-2066703 61 | 1/2020 |
| WO | WO 2019/144646 A1 | 8/2019 |

OTHER PUBLICATIONS

Fundaro, Peter., "Impedance Track™ Based Fuel Gauging", *Texas Instruments*, 2007 (pp. 1-11).

Yu, Ming et al., "Theory and Implementation of Impedance Track™ Battery Fuel-Gauging Algorithm in bq2750x Family", *Texas Instruments*, Jan. 2008 (pp. 1-11).

"Gauging Algorithm Comparisons", *Texas Instruments*, 2011 (pp. 1-52).

Ahiakwo, Onyx., "Battery Fuel Gauging Deep Dive: Characterization, programming, and going to production with TI's impedance track algorithm", *Texas Instruments*, 2019 (pp. 1-30).

\* cited by examiner

METHOD AND APPARATUS WITH BATTERY STATE ESTIMATION

CROSS-REFERENCE TO RELATED APPLICATIONS

This application claims the benefit under 35 USC § 119(a) of Korean Patent Application No. 10-2020-0111026 filed on Sep. 1, 2020, in the Korean Intellectual Property Office, the entire disclosure of which is incorporated herein by reference for all purposes.

BACKGROUND

1. Field

The following description relates to a method and apparatus with battery state estimation.

2. Description of Related Art

For an optimal operation of a battery, a state of the battery may be estimated. To estimate a state of a battery, various methods may be used. For example, a state of a battery may be estimated by integrating or adding up currents of the battery or using a battery model, for example, an electric circuit model or an electrochemical model.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a processor-implemented method with battery state estimation, including estimating a current state of charge (SOC) of a target battery by correcting a first electrochemical model corresponding to the target battery using a first voltage difference between a measured voltage of the target battery and an estimated voltage of the target battery that is estimated by the first electrochemical model, estimating an end SOC of the target battery by correcting a second electrochemical model using a second voltage difference between an estimated voltage of a virtual battery that is estimated by the second electrochemical model and a preset voltage, and estimating a relative SOC (RSOC) of the target battery based on the current SOC and the end SOC of the target battery, wherein the second electrochemical model is based on the virtual battery corresponding to the target battery being discharged to reach the preset voltage.

The estimating of the end SOC may include estimating a current SOC of the virtual battery using the second electrochemical model updated, in response to the estimated voltage of the virtual battery corresponding to the preset voltage, and determining the current SOC of the virtual battery to be the end SOC of the target battery.

The first electrochemical model and the second electrochemical model may have a same physical property parameter and different internal state information.

The end SOC may be an SOC obtained as the target battery is discharged by a current output from the target battery and reaches the preset voltage.

The estimating of the end SOC may include determining a state variation of the virtual battery using the second voltage difference, updating an internal state of the second electrochemical model based on the determined state variation of the virtual battery, and estimating state information of the virtual battery based on the updated internal state of the second electrochemical model.

The state variation of the virtual battery may be based on the second voltage difference, previous state information estimated by the second electrochemical model, and an open-circuit voltage (OCV) table.

The state variation of the virtual battery may be determined by obtaining an OCV corresponding to the previous state information based on the OCV table, and applying the second voltage difference to the obtained OCV.

The internal state of the second electrochemical model may be updated by correcting an ion concentration distribution in an active material particle or an ion concentration distribution in an electrode based on the state variation of the virtual battery.

The internal state of the second electrochemical model may include at least one of a positive electrode lithium ion concentration distribution, a negative electrode lithium ion concentration distribution, or an electrolyte lithium ion concentration distribution of the virtual battery.

The estimating of the RSOC may include estimating the RSOC based on one of the current SOC and the end SOC that is estimated in a current period, and the other one of the current SOC and an end SOC estimated in a previous period.

The estimating of the end SOC may be performed after the estimating of the current SOC is performed for a number of times.

The target battery may include a plurality of batteries, the estimating of the current SOC is performed on each of the plurality of batteries, and the estimating of the end SOC is performed on a representative battery from among the plurality of batteries, wherein the estimating of the RSOC may include estimating an RSOC of each of the plurality of batteries based on a current SOC estimated from each of the plurality of batteries and an end SOC estimated from the representative battery.

The estimating of the end SOC may include estimating a plurality of end SOCs using a plurality of virtual batteries indicating a virtual situation that the target battery is discharged by different currents to reach the preset voltage, wherein the estimating of the RSOC may include estimating a plurality of RSOCs of the target battery based on the current SOC of the target battery and the estimated end SOCs.

The preset voltage may be an end-of-discharge voltage (EDV) of the target battery.

The target battery may be a battery cell, a battery module, or a battery pack.

In another general aspect, there is provided a processor-implemented method with battery state estimation, including determining a state variation of a virtual battery corresponding to a target battery that is discharged to reach a preset voltage, using a voltage difference between an estimated voltage that is estimated by an electrochemical model corresponding to the virtual battery and a preset voltage, updating an internal state of the electrochemical model based on the determined state variation of the virtual battery, and estimating an end state of charge (SOC) of the target battery by estimating state information of the virtual battery based on the updated internal state of the electrochemical model.

The determining of the state variation of the virtual battery may include determining the state variation of the virtual battery based on the voltage difference, previous state information estimated by the electrochemical model, and an open-circuit voltage (OCV) table.

The updating of the internal state of the electrochemical model may include updating the internal state of the electrochemical model by correcting an ion concentration distribution in an active material particle or an ion concentration distribution in an electrode based on the state variation of the virtual battery.

In another general aspect, there is provided an apparatus with battery state estimation, including a memory configured to store a first electrochemical model corresponding to a target battery and a second electrochemical model based on a virtual battery corresponding to the target battery being discharged to reach a preset voltage, and a processor configured to estimate a current state of charge (SOC) of the target battery by correcting the first electrochemical model using a voltage difference between a measured voltage of the target battery and an estimated voltage of the target battery that is estimated by the first electrochemical model, estimate an end SOC of the target battery by correcting the second electrochemical model using a voltage difference between an estimated voltage of the virtual battery that is estimated by the second electrochemical model and the preset voltage, and estimate the RSOC of the target battery based on the current SOC and the end SOC of the target battery.

Other features and aspects will be apparent from the following detailed description, the drawings, and the claims.

Figure 1:
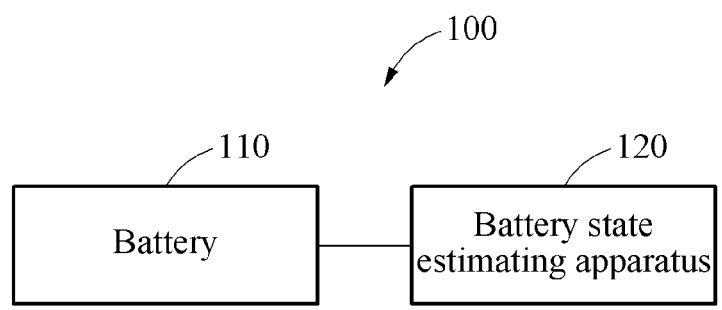
FIGS. 1 through 4 illustrate an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as A, B, C, (a), (b), (c) "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

If the specification states that one component is "connected," "coupled," or "joined" to a second component, the first component may be directly "connected," "coupled," or "joined" to the second component, or a third component may be "connected," "coupled," or "joined" between the first component and the second component. However, if the specification states that a first component is "directly connected" or "directly joined" to a second component, a third component may not be "connected" or "joined" between the first component and the second component. Similar expressions, for example, "between" and "immediately between" and "adjacent to" and "immediately adjacent to," are also to be construed in this manner.

Also, in the description of example embodiments, detailed description of structures or functions that are thereby known after an understanding of the disclosure of this application will be omitted when it is deemed that such description will cause ambiguous interpretation of the example embodiments.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIGS. 1 through 4 illustrate an example of a battery system.

Referring to FIG. 1, a battery system 100 includes a battery 110 and a battery state estimating apparatus 120. The battery state estimating apparatus 120 may also be referred to herein as an apparatus with battery state estimation.

The battery 110 may be at least one battery cell, battery module, or battery pack.

The battery state estimating apparatus 120 may sense the battery 110 using at least one sensor. That is, the battery state estimating apparatus 120 may collect sensing data of the battery 110. The sensing data may include, for example, voltage data, current data, and/or temperature data.

The battery state estimating apparatus 120 may estimate state information of the battery 110 based on the sensing data, and output a result of the estimating. The state information may include information associated with, for example, a state of charge (SOC), a relative SOC (RSOC), a state of heath (SOH), and/or abnormality. To estimate the state information, a battery model may be used, and the battery model may be an electrochemical model which will be described hereinafter with reference to FIG. 6.

Figure 2:
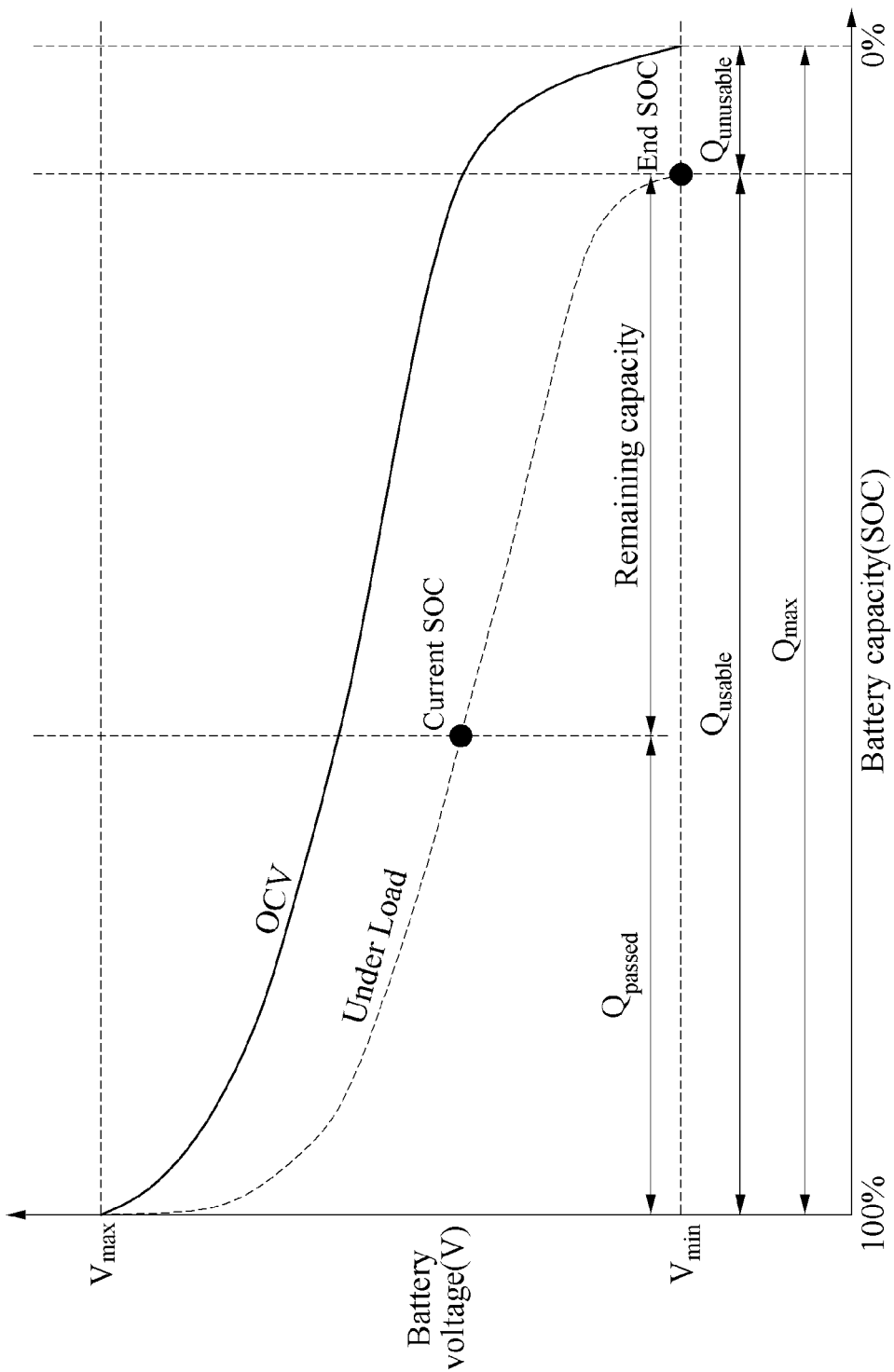

FIG. 2 illustrates a graph of an example of an SOC and an RSOC.

An SOC refers to a currently available (or usable) capacity compared to a total battery capacity designed based on an open-circuit voltage (OCV) and may be represented by Equation 1 below. The SOC may be determined based on an OCV graph illustrated in FIG. 2. Referring to FIG. 2, $V_{max}$ indicates a fully-charged voltage which is a voltage at which a battery is fully charged, and $V_{min}$ indicates an end-of-discharge voltage (EDV) which is a voltage at which the battery is fully discharged based on an OCV. $V_{min}$ also indicates a voltage that is set in advance by a manufacturer to prevent the battery from being discharged any further.

$$SOC = \frac{Q_{max} - Q_{passed}}{Q_{max}} \quad \text{[Equation 1]}$$

In Equation 1 above, $Q_{max}$ denotes a designed capacity, which is a total battery capacity designed based on an OCV. $Q_{passed}$ denotes a battery capacity used up to a current point in time. Thus, $Q_{max}-Q_{passed}$ indicates a currently available capacity based on an OCV. Such an SOC may also be referred to as an absolute SOC (ASOC) because it indicates an absolute SOC irrespective of a discharge current, or as a current SOC because it indicates a battery SOC in a current state.

In an example, a battery may be discharged by applying a current to a load connected thereto. In such an actual example of use, an RSOC based on an under-load voltage may be used instead of an OCV-based SOC. The RSOC refers to a currently available capacity compared to a total available capacity based on a voltage in a state in which a current is applied, and may indicate a capacity available for a user to use on a user's part. The RSOC may be determined based on an under-load voltage graph illustrated in FIG. 2.

$$RSOC = \frac{Q_{usable} - Q_{passed}}{Q_{usable}} \quad \text{[Equation 2]}$$
$$= \frac{Q_{max} - Q_{passed} - Q_{unusable}}{Q_{max} - Q_{unusable}}$$
$$= \frac{\frac{Q_{max} - Q_{passed}}{Q_{max}} - \frac{Q_{unusable}}{Q_{max}}}{1 - \frac{Q_{unusable}}{Q_{max}}}$$
$$= \frac{\text{Current } SOC - \text{End } SOC}{1 - \text{End } SOC}$$

In Equation 2 above, $Q_{usable}$ denotes a full charge capacity (FCC), which is a total available capacity based on a voltage in a state in which a load is connected to a battery and a current is applied. $Q_{usable}$ may be determined by $Q_{max}-Q_{unusable}$. $Q_{unusable}$ denotes a capacity that is not available to use as the battery connected to the load reaches an EDV and further discharging is limited. $Q_{unusable}$ may change based on a magnitude of a current, a temperature, and/or a degradation state of the battery.

For example, when the battery is connected to the load and a current is output from the battery, an output voltage of the battery may become lower than an OCV, and thus the under-load voltage graph may have a smaller value than the OCV graph as illustrated in FIG. 2. That is, when the current output from the battery increases, a gap between the under-load graph and the OCV graph may increase. In addition, when the current output from the battery increases, $Q_{unusable}$ may also increase.

To predict an accurate RSOC of the battery, accurate $Q_{usable}$ and $Q_{passed}$ may need to be predicted. However, it may not be easy to accurately predict $Q_{usable}$ because it is determined based on $Q_{unusable}$ that is affected by a magnitude of a current and a temperature as described above. Thus, an RSOC may be represented by an equation not about Q, but about an SOC, as in Equation 2. That is, the RSOC may be determined based on a current SOC and an end SOC. The end SOC refers to an SOC at a time when the battery is discharged by an applied current and then reaches an EDV. That is, the end SOC may be an SOC at an EDV, and may change based on a magnitude of a current, a temperature, and/or a degradation state of the battery. The end SOC may also be referred to herein as $SOC_{EDV}$.

In an example, a magnitude of an output current of a battery may vary according to an operation type of a device in which the battery is provided. For example, based on various operation types (e.g., playing music, a video, or a game, or operating in an idle state, in a smartphone), a magnitude of the output current may change and an end SOC may change, and an RSOC may also change based on this. For example, when playing a video, an available operation time of a device may be shorter than when playing music. As described above, the end SOC may be a result of estimating an SOC at a time when the battery is discharged by a magnitude of a currently applied current and reaches an EDV, and of predicting a future state from a current state. Hereinafter, estimating an RSOC will be described in detail with reference to the accompanying drawings.

Figure 3:
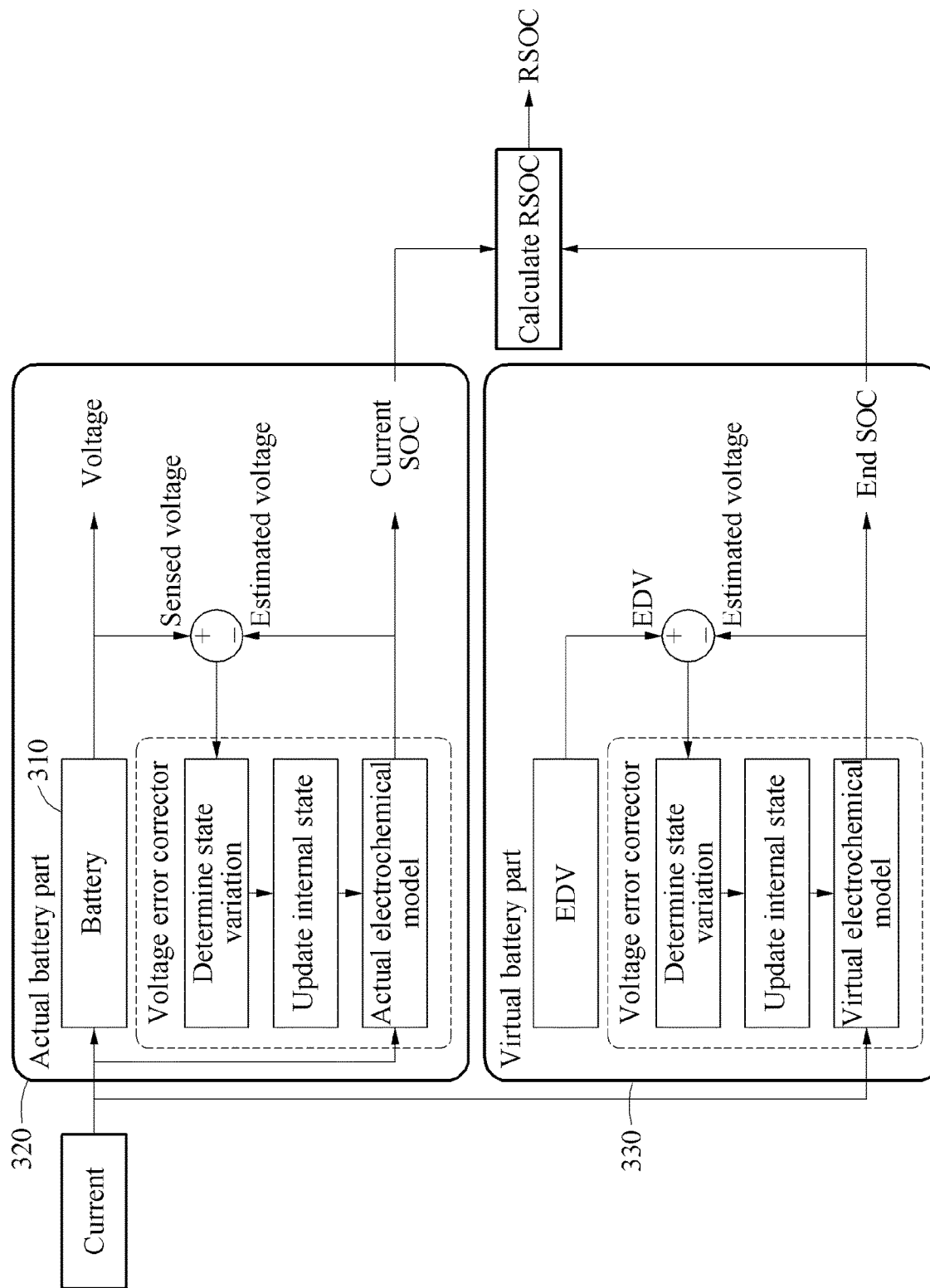

FIG. 3 illustrates an example of estimating state information using a battery model.

Referring to FIG. 3, a battery state estimating apparatus may estimate state information of a battery 310 using an electrochemical model. The electrochemical model refers to a model that models an internal physical phenomenon that occurs inside the battery, such as, for example, a potential and an ion concentration distribution of a battery, and estimates state information of the battery. The electrochemical model will be described in detail with reference to FIG. 6.

Accuracy in estimating the state information of the battery 310 may affect an optimal operation and control of the battery 310. In the estimation of the state information using the electrochemical model, there may be an error between sensor information input to the electrochemical model, for example, current, voltage, and temperature data, and estimated information obtained through a calculation based on a modeling method. Thus, to correct such an error, error correction may need to be performed.

As described above, to estimate an RSOC, a current SOC and an end SOC may be needed. The current SOC may be estimated in an actual battery part 320 and the end SOC may be estimated in a virtual battery part 330.

The actual battery part 320 may be a part of estimating a current SOC of the battery 310. The battery 310 may also be referred to herein as an actual battery or a target battery to distinguish it from a virtual battery to be described hereinafter. An actual electrochemical model may be a model that estimates the state information of the battery 310 by modeling an internal physical phenomenon of the battery 310. Input data of the actual electrochemical model may include information associated with a voltage, a current, and a temperature of the battery 310 that are measured in real time.

To estimate the current SOC of the battery 310, the battery state estimating apparatus may determine a voltage difference between a sensed voltage of the battery 310 that is measured by a sensor and an estimated voltage of the battery 310 that is estimated by the actual electrochemical model. In an example, the battery state estimating apparatus may determine a state variation of the battery 310 using the determined voltage difference. The battery state estimating apparatus may then update an internal state of the actual electrochemical model based on the determined state variation. The battery state estimating apparatus may then estimate the current SOC of the battery 310 based on the updated internal state of the actual electrochemical model.

Through a feedback structure that corrects the internal state of the actual electrochemical model such that the voltage difference between the sensed voltage of the battery 310 and the estimated voltage of the battery 310 is minimized, the battery state estimating apparatus may estimate the current SOC of the battery 310 with a high level of accuracy while minimizing a model complexity and an increase in computational amount.

In addition, the virtual battery part 330 may be a part of estimating an end SOC of the battery 310. To estimate the end SOC, the virtual battery indicating a virtual situation that the battery 310 is discharged to reach a preset voltage (e.g., EDV) may be used. A virtual electrochemical model may be a model that estimates state information of the virtual battery by modeling an internal physical phenomenon of the virtual battery. An estimated SOC of the virtual battery may correspond to the end SOC of the battery 310.

The virtual electrochemical model may have the same physical property parameters as the actual electrochemical model and have different internal state information from the actual electrochemical model. For example, the physical property parameters may include, for example, a characteristic (e.g., size, shape, etc.) of an active material particle, a thickness of an electrode, a thickness of an electrolyte, and a physical property value (e.g., electrical conductance, ionic conductance, diffusion coefficient, etc.). The internal state information may include, for example, a potential in an active material particle, an ion concentration distribution in an active material particle, a potential in an electrode, an ion concentration distribution in an electrode, and the like. Input data of the virtual electrochemical model may include information associated with a moving average current, a moving average temperature, and an EDV of the battery 310. For example, the moving average current may be a moving average current for a period of time. In an example, the period may be preset. In some examples, information associated with a currently applied current, an arithmetic average current for a preset period of time, and a weighted average current, instead of the moving average current, may be input to the virtual electrochemical model. In another example, instead of the moving average temperature, information associated with a current temperature, an arithmetic average temperature, and a weighted average temperature, may be input to the virtual electrochemical model. In addition to the foregoing examples, other current and temperature information determined to have various characteristics indicating averages may also be input to the virtual electrochemical model.

To estimate the end SOC of the battery 310, the battery state estimating apparatus may determine a voltage difference between an estimated voltage of the virtual battery that is estimated by the virtual electrochemical model and an EDV. The battery state estimating apparatus may then determine a state variation of the virtual battery using the determined voltage difference. The battery state estimating apparatus may then update an internal state of the virtual electrochemical model based on the determined state variation. The battery state estimating apparatus may then estimate an SOC of the virtual battery based on the updated internal state of the virtual electrochemical model to determine the end SOC of the battery 310.

Through a feedback structure that corrects the internal state of the virtual electrochemical model such that the estimated voltage of the virtual battery matches the EDV, the battery state estimating apparatus may estimate the end SOC of the battery 310 with a high level of accuracy while minimizing a model complexity and minimizing computational amount.

In addition, the battery state estimating apparatus may calculate an RSOC of the battery 310 based on the current SOC and the end SOC. For a more detailed description of the calculation of the RSOC, reference may be made to what is described above with reference to Equation 2 above.

In an example, the battery state estimating apparatus may estimate rapidly and accurately the RSOC of the battery 310, through a dual-cell model that is based on the two electrochemical models and correctors configured to correct the respective internal states of the electrochemical models.

Figure 4:
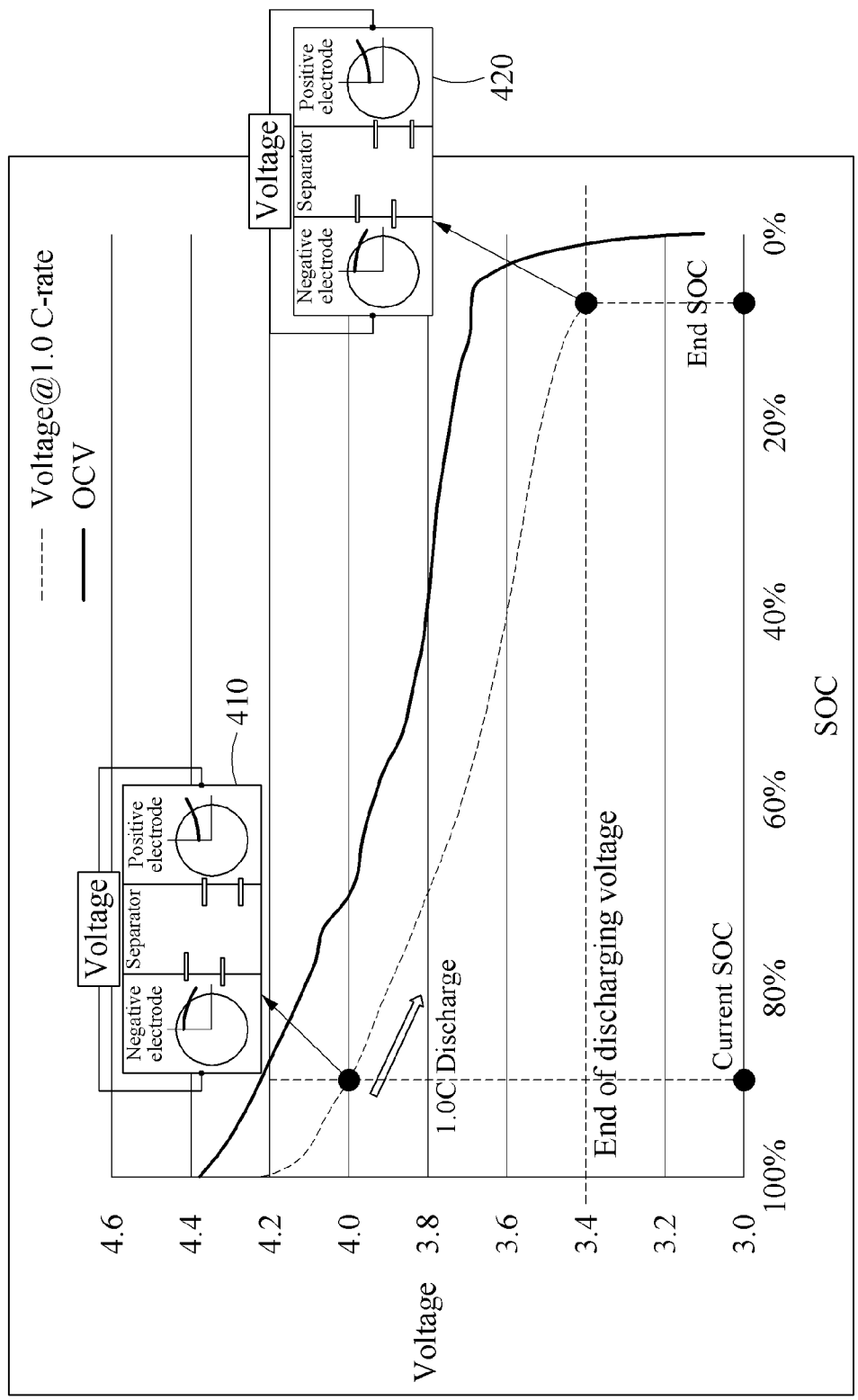

FIG. 4 illustrates an example of an operation of a dual-cell model. In the example of FIG. 4, detailed numerical values are provided merely for the convenience of description, and thus examples are not limited thereto. Other numerical values may be used without departing from the spirit and scope of the illustrative examples described.

Referring to FIG. 4, a battery state estimating apparatus may determine an RSOC based on a current SOC that is estimated by an actual electrochemical model 410 and an end SOC that is estimated by a virtual electrochemical model 420. To minimize an amount of time used for predicting the RSOC, a time for estimating the end SOC as well as the current SOC may be minimized. To minimize the amount of time it is assumed that a virtual battery is present around an EDV, the method may directly estimate the end SOC by correcting the virtual electrochemical model 420 corresponding to the virtual battery such that a voltage estimated by the virtual electrochemical model 420 reaches the EDV. Unlike a simulation method that discharges a battery starting from a current SOC position, the method of directly estimating the end SOC from the virtual electrochemical model 420 around the EDV may be used to minimize the time for estimating the end SOC by performing a calculation only around the EDV to obtain the end SOC.

Figure 5:
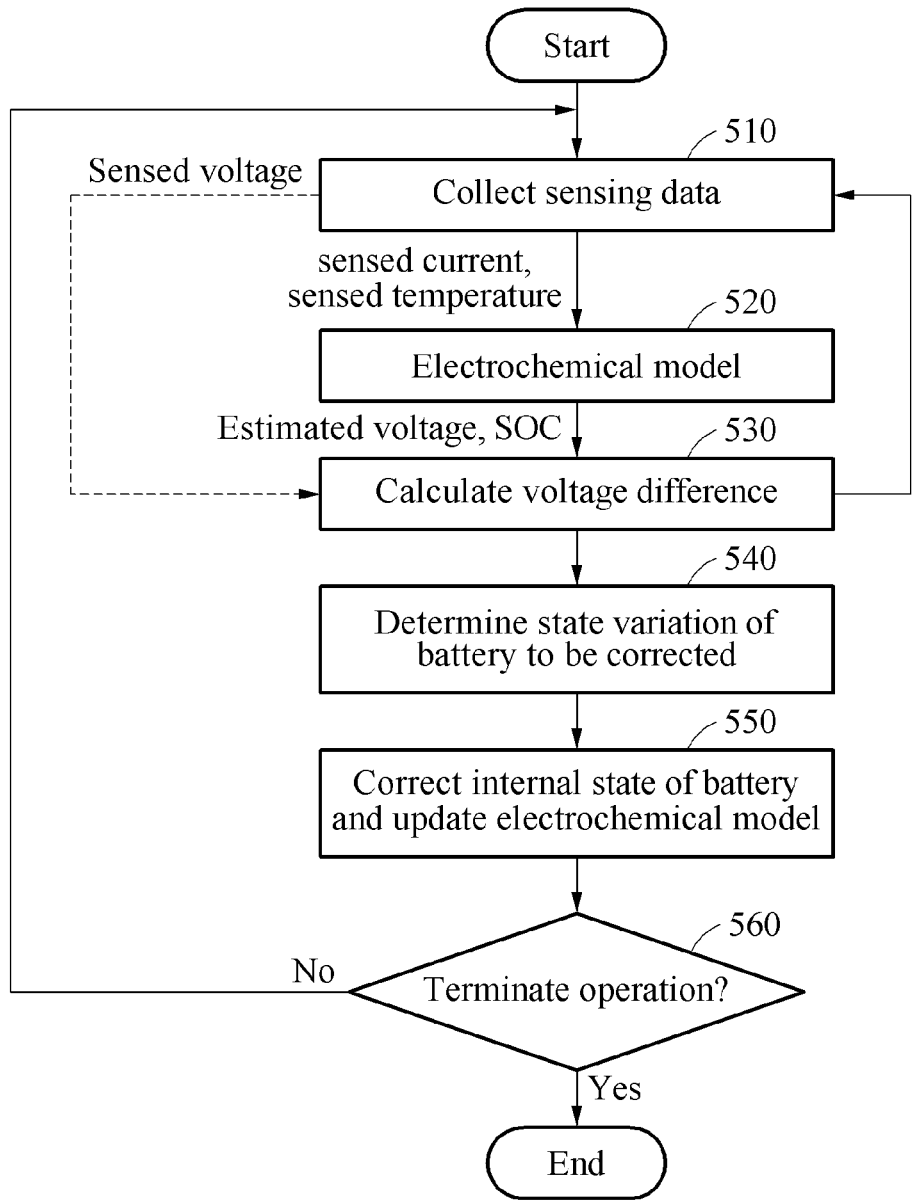
FIG. 5 illustrates an example of a battery state estimating method.

FIG. 5 illustrates an example of a battery state estimating method. FIG. 5 illustrates an example of a method of training a neural network to generate an image. The operations in FIG. 5 may be performed in the sequence and manner as shown, although the order of some operations may be changed or some of the operations omitted without departing from the spirit and scope of the illustrative examples described. Many of the operations shown in FIG. 5 may be performed in parallel or concurrently. One or more blocks of FIG. 5, and combinations of the blocks, can be implemented by special purpose hardware-based computer, such as a processor, that perform the specified functions, or combinations of special purpose hardware and computer instructions. In addition to the description of FIG. 5 below, the descriptions of FIGS. 1-4 are also applicable to FIG. 5, and are incorporated herein by reference. Thus, the above description may not be repeated here.

Referring to FIG. 5, a battery state estimating apparatus may estimate state information of a battery. A state of the battery may be estimated in a plurality of time periods, and the battery state estimating apparatus may estimate the state information of the battery in each of the time periods. Hereinafter, estimating a current SOC in an actual battery part will be described first.

In operation 510, the battery state estimating apparatus collects sensing data of a battery. The sensing data may include a sensed voltage, a sensed current, and a sensed temperature of the battery. In an example, the sensing data may be stored in a form of a profile indicating a change in a magnitude over time.

In operation 520, an estimated voltage and state information (e.g., current SOC) of the battery are determined by an electrochemical model to which the sensed current and the sensed temperature are input.

In operation 530, the battery state estimating apparatus calculates a voltage difference between the sensed voltage of the battery and the estimated voltage that is estimated by the electrochemical model. For example, the voltage difference may be determined to be a moving average voltage for a latest time period.

Although not illustrated in FIG. 5, according to an example, the battery state estimating apparatus may determine whether the state information of the battery needs to be corrected based on whether the voltage difference exceeds a threshold voltage difference. When an error occurs in the electrochemical model, the estimated voltage, which is a voltage estimated using the electrochemical model, may differ from the sensed voltage of the battery. Thus, to prevent such errors from being accumulated, the battery state estimating apparatus may determine whether the correcting is needed based on the voltage difference.

For example, when the voltage difference exceeds a threshold voltage, the battery state estimating apparatus may determine that the state information of the battery needs to be corrected and perform operation 540. In another example, when the voltage difference does not exceed the threshold voltage, the battery state estimating apparatus may determine that the state information of the battery does not need to be corrected and return to operation 510 without performing operations 540, 550, and 560.

In operation 540, the battery state estimating apparatus determines a state variation of the battery using the voltage difference. For example, the battery state estimating apparatus may determine the state variation of the battery based on the voltage difference, previous state information of the battery, and an OCV table. The previous state information of the battery may be state information estimated previously using the electrochemical model in operation 520. For example, the state variation of the battery may include an SOC variation, which will be described in detail with reference to FIGS. 7 and 8.

In operation 550, the battery state estimating apparatus updates the electrochemical model by correcting an internal state of the electrochemical model based on the state variation of the battery. For example, the battery state estimating apparatus may update the internal state of the electrochemical model by correcting an ion concentration distribution in an active material particle or an ion concentration distribution in an electrode based on the state variation of the battery. Here, an active material may include a positive electrode and a negative electrode of the battery. The battery state estimating apparatus may estimate the state information of the battery using the electrochemical model of which the internal state is updated. Through such a feedback structure that updates the internal state of the electrochemical model by determining the state variation of the battery such that the voltage difference between the sensed voltage and the estimated voltage is minimized, the battery state estimating apparatus may estimate the state information of the battery with a high level of accuracy using a lesser computational resources. A detailed description will be provided with reference to FIGS. 9 through 11.

In operation 560, the battery state estimating apparatus determines whether to terminate an operation of estimating a state of the battery. For example, when a preset operation time has not elapsed, operation 510 may be performed in a next time period. In contrast, when the preset operation period has elapsed, the operation of estimating a state of the battery may be terminated.

Hereinafter, estimating an end SOC in a virtual battery part will be described. The estimating of the end SOC will be described based on a difference from the estimating of the current SOC which is described above. For example, the electrochemical model used in operation 520 may be an actual electrochemical model corresponding to an actual battery in the actual battery part, whereas an electrochemical model corresponding to a virtual battery in the virtual battery part may be a virtual electrochemical model. In addition, in operation 530 of calculating a voltage difference, a voltage difference between an estimated voltage of the virtual battery and a preset EDV may be calculated in the virtual battery part. For a more detailed description of the remaining operations, reference may be made to the foregoing description.

Figure 6:
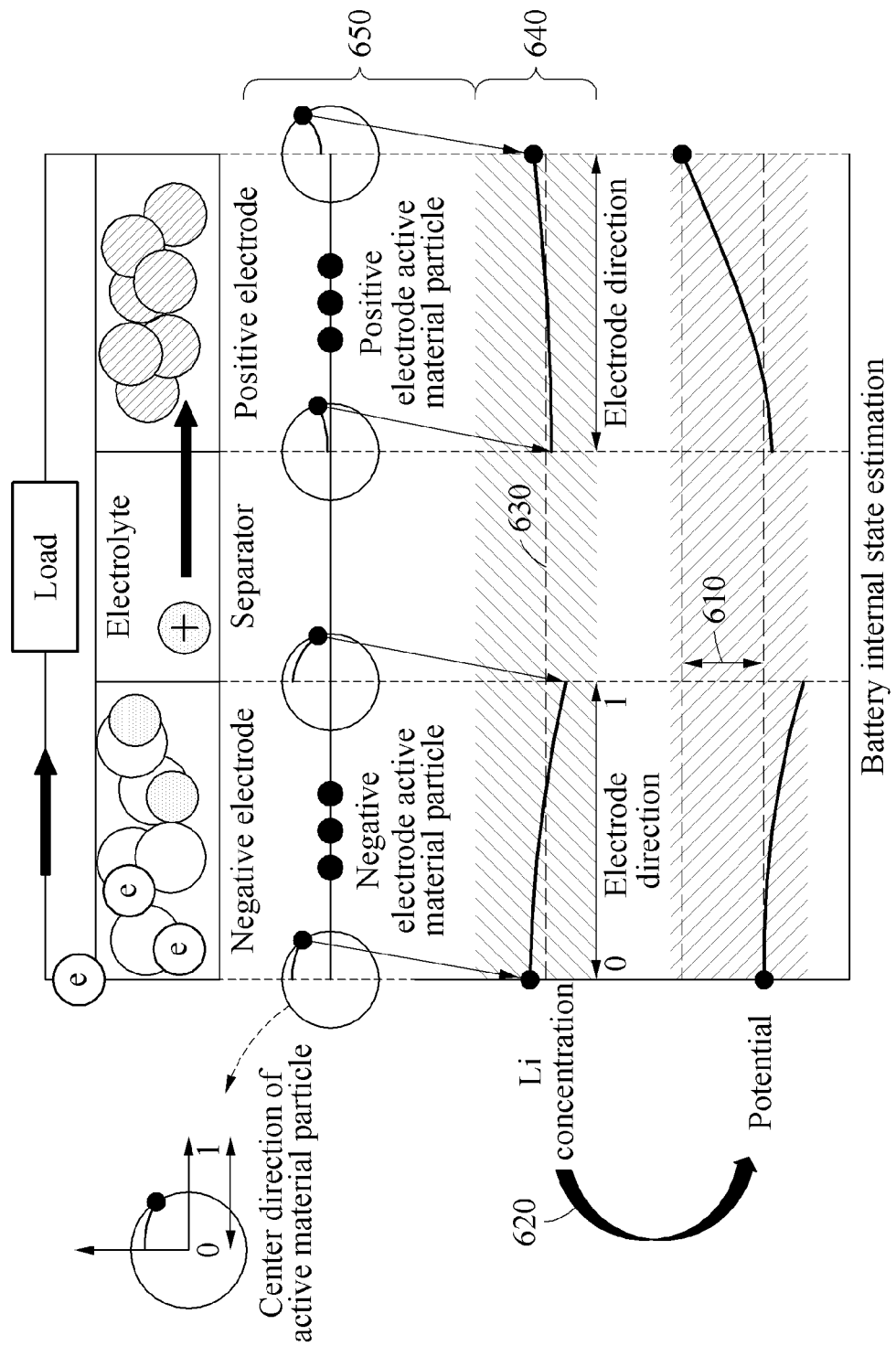
FIG. 6 illustrates an example of an electrochemical model.

FIG. 6 illustrates an example of an electrochemical model.

Referring to FIG. 6, an electrochemical model may estimate a remaining amount or SOC of a battery by modeling an internal physical phenomenon of the battery, for example, an ion concentration, a potential, and the like of the battery. In an example, the electrochemical model may be represented by a physical conservation equation associated with an electrochemical reaction occurring on an electrode/electrolyte interface, a concentration of an electrode and an electrolyte, and conservation of electrical charges. For the physical conservation equation, the electrochemical model may use various model parameters, such as, for example, a shape (e.g., thickness, radius, etc.), an open-circuit potential (OCP), and a physical property value (e.g., electrical conductance, ionic conductance, diffusion coefficient, etc.).

In the electrochemical model, various state variables, such as, for example, a concentration and a potential, may be coupled to one another. An estimated voltage 610 of a battery that is estimated by the electrochemical model may indicate a potential difference between both ends, which are a positive electrode and a negative electrode. As illustrated by reference numeral 620, potential information of each of the positive electrode and the negative electrode may be affected by an ion concentration distribution in each of the positive electrode and the negative electrode. An SOC 630 to be estimated by the electrochemical model may indicate an average ion concentration of the positive electrode and the negative electrode.

The ion concentration distribution described above may be an ion concentration distribution 640 in an electrode or an ion concentration distribution 650 in an active material particle present at a certain position in the electrode. The ion concentration distribution 640 in the electrode may be a surface ion concentration distribution or an average ion concentration distribution of the active material particle positioned in an electrode direction. The electrode direction may be a direction connecting one end (e.g., a boundary adjacent to a current collector) of the electrode and another end of the electrode (e.g., a boundary adjacent to a separator). In addition, the ion concentration distribution 650 in the active material particle may be an ion concentration distribution in the active material particle based on a center direction of the active material particle. The center direction of the active material particle may be a direction connecting a center of the active material particle and a surface of the active material particle.

As described above, to reduce a voltage difference between a sensed voltage of a battery and an estimated voltage of the battery, or a voltage difference between a preset EDV and an estimated voltage, a battery state estimating apparatus may move or change an ion concentration distribution of each of a positive electrode and a negative electrode while maintaining physical conservation associated with a concentration, obtain potential information of each of the positive electrode and the negative electrode based on the moved ion concentration distribution, and calculate a voltage based on the obtained potential information. The battery state estimating apparatus may obtain an internal state variation at which the voltage difference is to be 0 and finally determine a current SOC or an end SOC of the battery.

Figure 7:
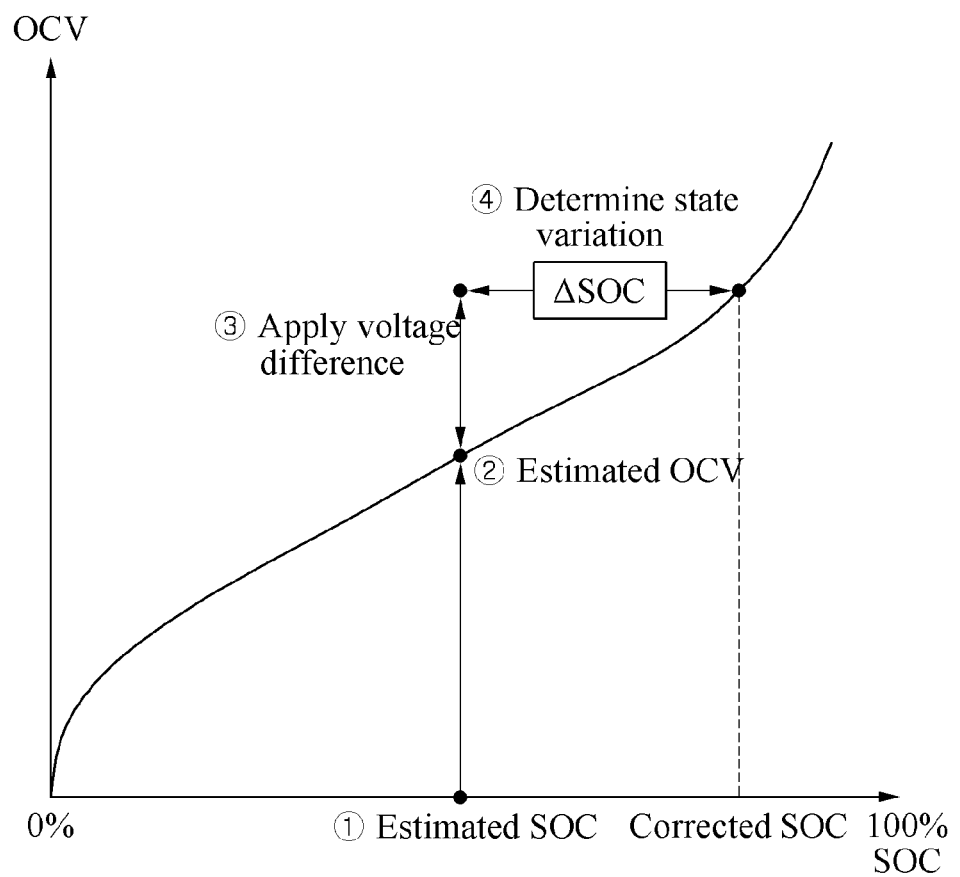
FIGS. 7 and 8 illustrate examples of graphs for determining a state variation of a battery.
Figure 8:
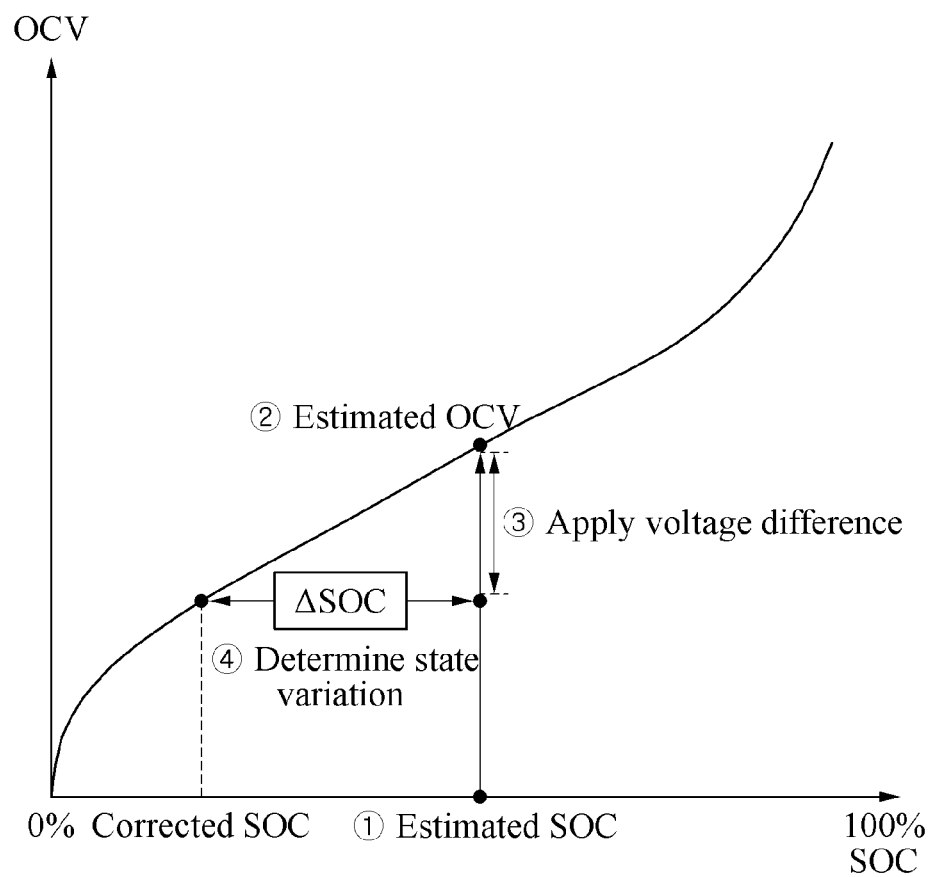

FIGS. 7 and 8 illustrate graphs of examples of determining a state variation of a battery.

FIG. 7 illustrates an example of determining a state variation of a battery in a case in which a sensed voltage or an EDV of the battery is greater than an estimated voltage of the battery that is estimated by an electrochemical model. The estimated voltage may be a voltage of the battery that is estimated in a previous time period.

In an example, an OCV table indicates an SOC-OCV curve indicating an intrinsic characteristic of a battery. An actual electrochemical model and a virtual electrochemical model may have the same physical property parameters, and thus the same OCV table may be used to obtain a current SOC and an end SOC. When using the OCV table, ASOC to be corrected may vary according to an SOC value, and SOC information of a previous time period that is previously (e.g., most recently) estimated may be used. The SOC information of the previous time period may be an estimated SOC of the battery in the previous time period.

An estimated OCV, which is an OCV corresponding to the SOC information of the previous time period, may be obtained through the characteristic curve of the OCV table illustrated in FIG. 7. A previously calculated voltage difference may be applied to the estimated OCV. This example pertains to a case in which the sensed voltage or the EDV is greater than the estimated voltage, and thus the calculated voltage difference may be applied by adding the calculated voltage difference to the estimated OCV. Using the characteristic curve of the OCV table, a corrected SOC corresponding to a result of applying the calculated voltage difference may be determined, and a difference between the estimated SOC and the corrected SOC may be determined to be ASOC which indicates a state variation.

FIG. 8 illustrates an example of determining a state variation of a battery in a case in which a sensed voltage or an EDV of the battery is less than an estimated voltage of the battery that is estimated by an electrochemical model.

As described above, when using an OCV table, SOC information of a previous time period that is previously estimated (e.g., most recently) may be used. An estimated OCV, which is an OCV corresponding to the SOC information of the previous time period, may be obtained through the characteristic curve of the OCV table illustrated in FIG. 8. A previously calculated voltage difference may be applied to the estimated OCV. This example pertains to a case in which the sensed voltage or the EDV is less than the estimated voltage, and thus the calculated voltage difference may be applied by subtracting the calculated voltage difference from the estimated OCV. Using the characteristic curve of the OCV table, a corrected SOC corresponding to a result of applying the calculated voltage difference may be determined, and a difference between the estimated SOC and the corrected SOC may be determined to be ASOC which indicates a state variation.

Figure 9:
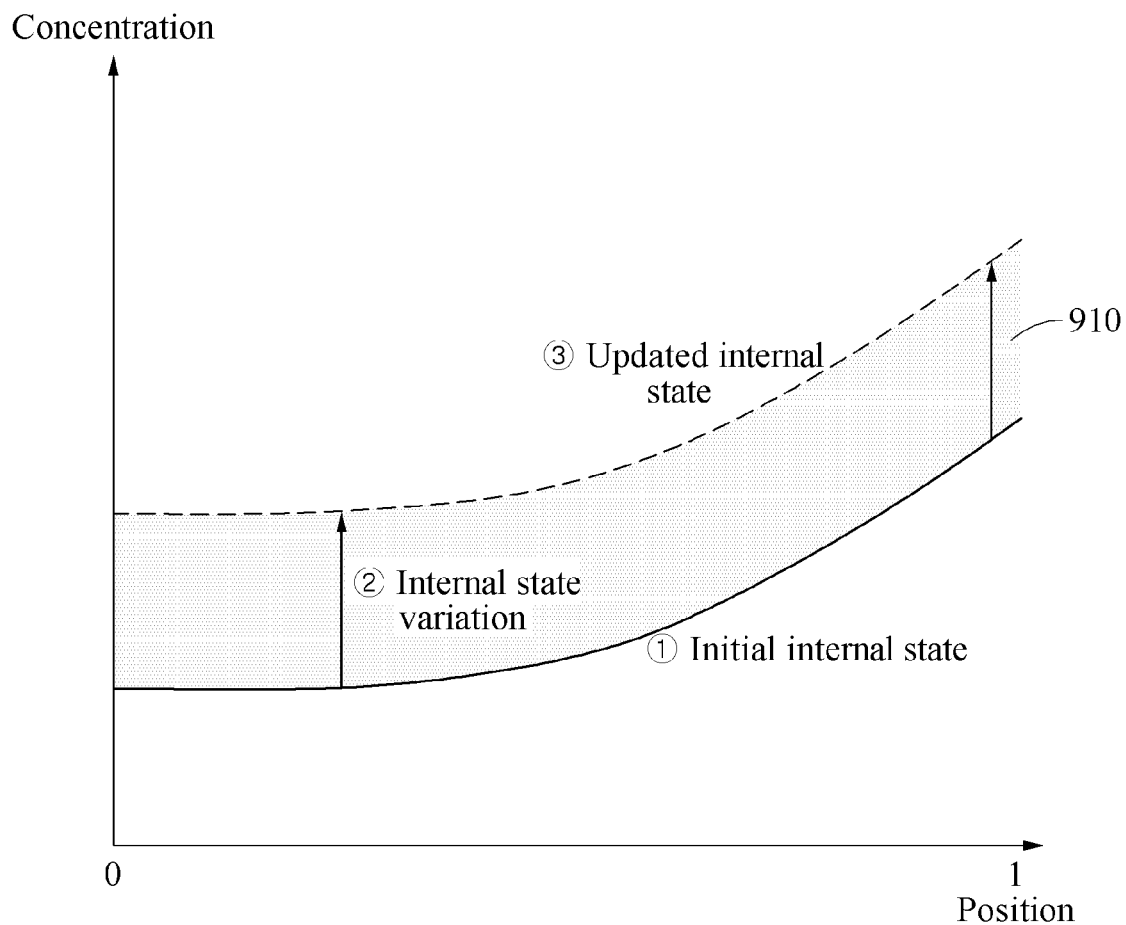
FIGS. 9 through 11 illustrate examples of graphs for updating an internal state of a battery model.
Figure 10:
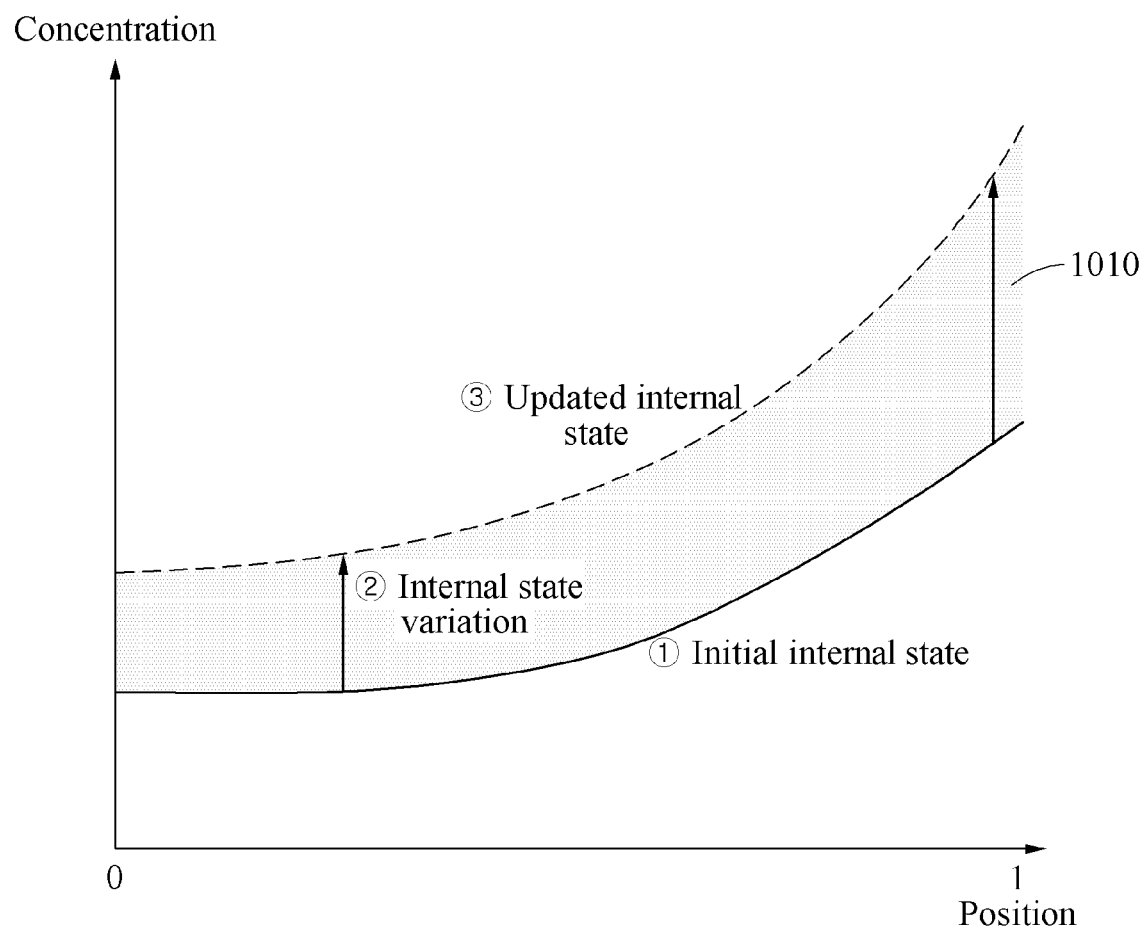
Figure 11:
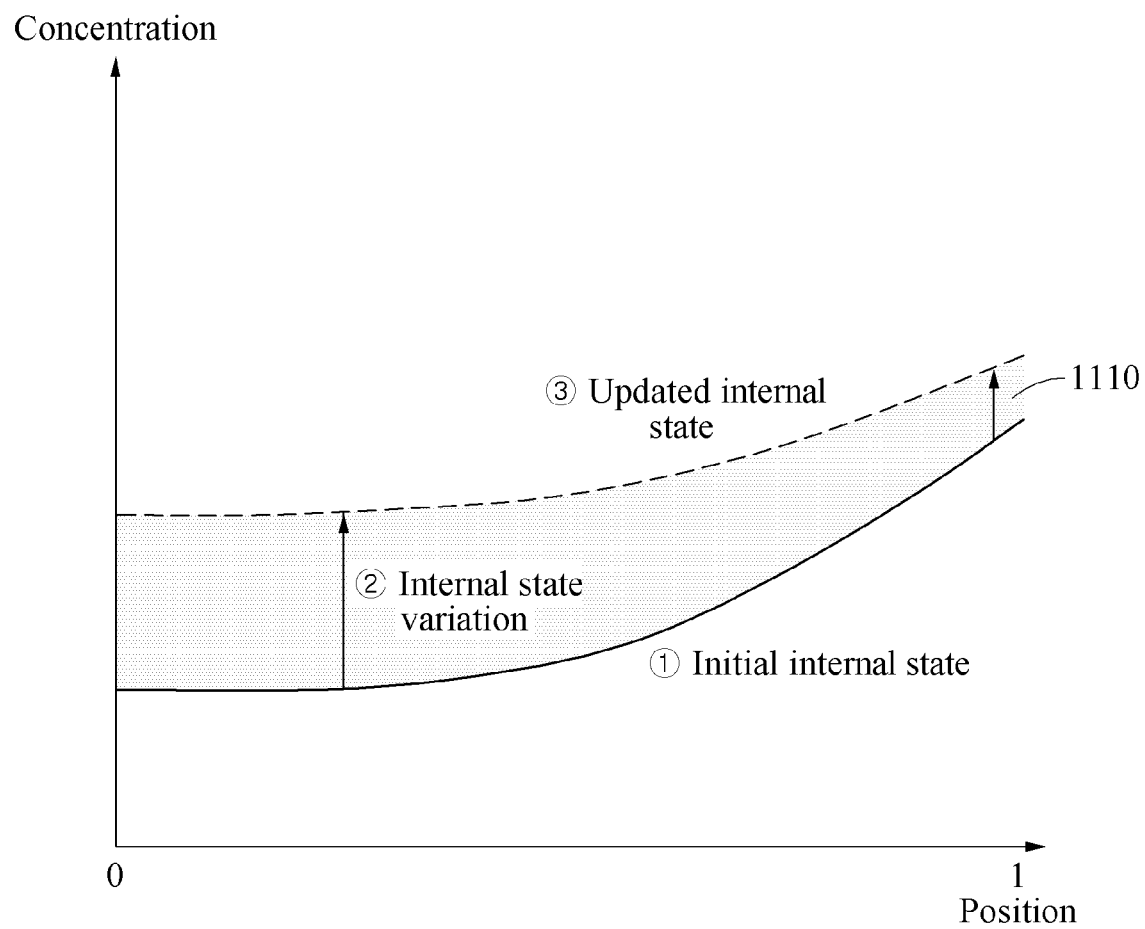

FIGS. 9 through 11 illustrate graphs of examples of updating an internal state of a battery model.

In an example, a battery state estimating apparatus may update an internal state of an electrochemical model based on a state variation of a battery. The electrochemical model may model an internal physical phenomenon of the battery and estimate state information of the battery. The internal state of the electrochemical model may be provided in a form of a profile and may include, for example, a voltage, an overpotential, an SOC, a positive electrode lithium ion concentration distribution, a negative electrode lithium ion concentration distribution, and/or an electrolyte lithium ion concentration distribution. For example, the battery state estimating apparatus may update the internal state of the electrochemical model by correcting an ion concentration distribution in an active material particle or an ion concentration distribution in an electrode based on the state variation of the battery. A more detailed description of updating an internal state of an electrochemical model will follow hereinafter with reference to FIGS. 9 through 11.

FIG. 9 illustrates an example of updating an internal state of an electrochemical model by uniformly correcting an ion concentration distribution. In this example, the ion concentration distribution may indicate an ion concentration distribution in an active material particle or an ion concentration distribution in an electrode. For example, when a graph illustrated in FIG. 9 indicates the ion concentration distribution in the active material particle, a horizontal axis of the graph indicates a position in the active material particle. In this example, 0 indicates a center of the active material particle and 1 indicates a surface of the active material particle. For another example, when the graph illustrated in FIG. 9 indicates the ion concentration distribution in the electrode, a horizontal axis of the graph indicates a position in the electrode. In this example, 0 indicates one end of the electrode (e.g., a boundary adjacent to a collector) and 1 indicates another end of the electrode (e.g., a boundary adjacent to a separator).

The battery state estimating apparatus may convert a state variation of a battery to a variation of an internal state, and uniformly apply the variation to the internal state of the electrochemical model. The variation of the internal state may indicate a lithium ion concentration variation which corresponds to an area 910 between an initial internal state and an updated internal state. Such a method of uniformly updating the internal state may be applied when a current output from the battery is not large under the assumption that a concentration variation is uniform or consistent. The method may be simpler in implementation compared to a nonuniform updating method to be described hereinafter.

in another example, when updating the internal state in which a lithium ion concentration increases in an active material of one of a positive electrode and a negative electrode, the internal state may be updated such that a lithium ion concentration in an active material of the other one of the positive electrode and the negative electrode decreases by an increment of the increase in the lithium ion concentration in the active material in the one electrode.

FIGS. 10 and 11 illustrate an example of updating an internal state of an electrochemical model by nonuniformly correcting an ion concentration distribution.

For example, when a conductance is substantially lowered, a current of a battery is relatively great, and/or a temperature of the battery is relatively low, an internal diffusion characteristic may be weakened based on a chemical characteristic of the battery, and accordingly, a gradient of the ion concentration distribution may increase in an electrode direction. In this example, based on the internal diffusion characteristic of the battery, an internal state of an electrochemical model may be nonuniformly updated at each position in the active material particle or each position in the electrode.

A lithium ion may move in the battery based on the diffusion characteristic. For example, when a lithium ion of the positive electrode moves to the negative electrode, a lithium ion that is located nearest to the negative electrode among lithium ions of the positive electrode may move first. In this example, when the internal diffusion characteristic of the battery is worse than before, lithium ions may move considerably slowly in the positive electrode and a spot of the lithium ion moved out to the negative electrode may not be rapidly filled, and thus only a lithium ion located at an end of the positive electrode may continuously move out to the negative electrode and a gradient of the ion concentration distribution may increase as illustrated in the graph of FIG. 10. In another example, when the internal diffusion characteristic of the battery is better than before, a lithium ion located in the positive electrode may rapidly move to an end to fill the spot of the lithium ion that has moved out to the negative electrode, and thus the gradient of the ion concentration distribution may decrease as illustrated in the graph of FIG. 11. An area between an initial internal state and an updated internal state, for example, an area 1010 of FIG. 10 and an area 1110 of FIG. 11, may correspond to a lithium ion concentration variation. Such diffusion characteristic as described above may be based on state information (e.g., SOC) of a battery, and thus a diffusion characteristic based on a state variation of the battery may be considered. A more detailed description of consideration of a diffusion characteristic based on a state variation of a battery will follow.

The battery state estimating apparatus may determine a concentration gradient characteristic based on the diffusion characteristic based on the state variation of the battery, and update the internal state of the electrochemical model based on the determined concentration gradient characteristic. A diffusion coefficient may be derived based on an analysis of a diffusion characteristic of a state direction in which a lithium ion is to move, for example, a direction in which a lithium ion concentration increases. For example, a diffusion coefficient based on a previous SOC and a diffusion coefficient of an SOC to move a lithium ion may be derived. In addition, the internal state of the electrochemical model may be updated based on a concentration gradient characteristic set in advance based on the diffusion coefficient. For example, when the diffusion coefficient decreases in a direction for the movement, the internal state of the electrochemical model may be updated in a direction in which the concentration gradient increases. In another example, when the diffusion coefficient increases in the direction for the movement, the internal state of the electrochemical model may be updated in a direction in which the concentration gradient decreases.

In another example, the electrochemical model may be a model based on a principle that a total amount of lithium ions is constantly conserved, although the lithium ions may move among a positive electrode, a negative electrode, and an electrolyte. Such movement of the lithium ions among the positive electrode, the negative electrode, and the electrolyte may be obtained based on a diffusion equation, which will be described in greater detail hereinafter.

The battery state estimating apparatus may calculate a diffusion equation of an active material based on the state variation of the battery, and update the internal state of the electrochemical model. The battery state estimating apparatus may assign a current boundary condition in a state direction to which a lithium ion is to move, for example, a direction in which a lithium ion concentration increases, to calculate the diffusion equation, and update the internal state of the electrochemical model. The battery state estimating apparatus may calculate the diffusion equation of the active material with respect to a variation of the internal state corresponding to the state variation of the battery, and update the internal state of the electrochemical model with an ion concentration distribution that is calculated through the diffusion equation. The diffusion characteristic is one physical characteristic among a plurality of physical characteristics, and thus the battery state estimating apparatus may nonuniformly update the internal state of the electrochemical model by calculating the diffusion equation with respect to the ion concentration distribution.

FIGS. 12 through 20 illustrate examples of estimating a relative SOC (RSOC).

Figure 12:
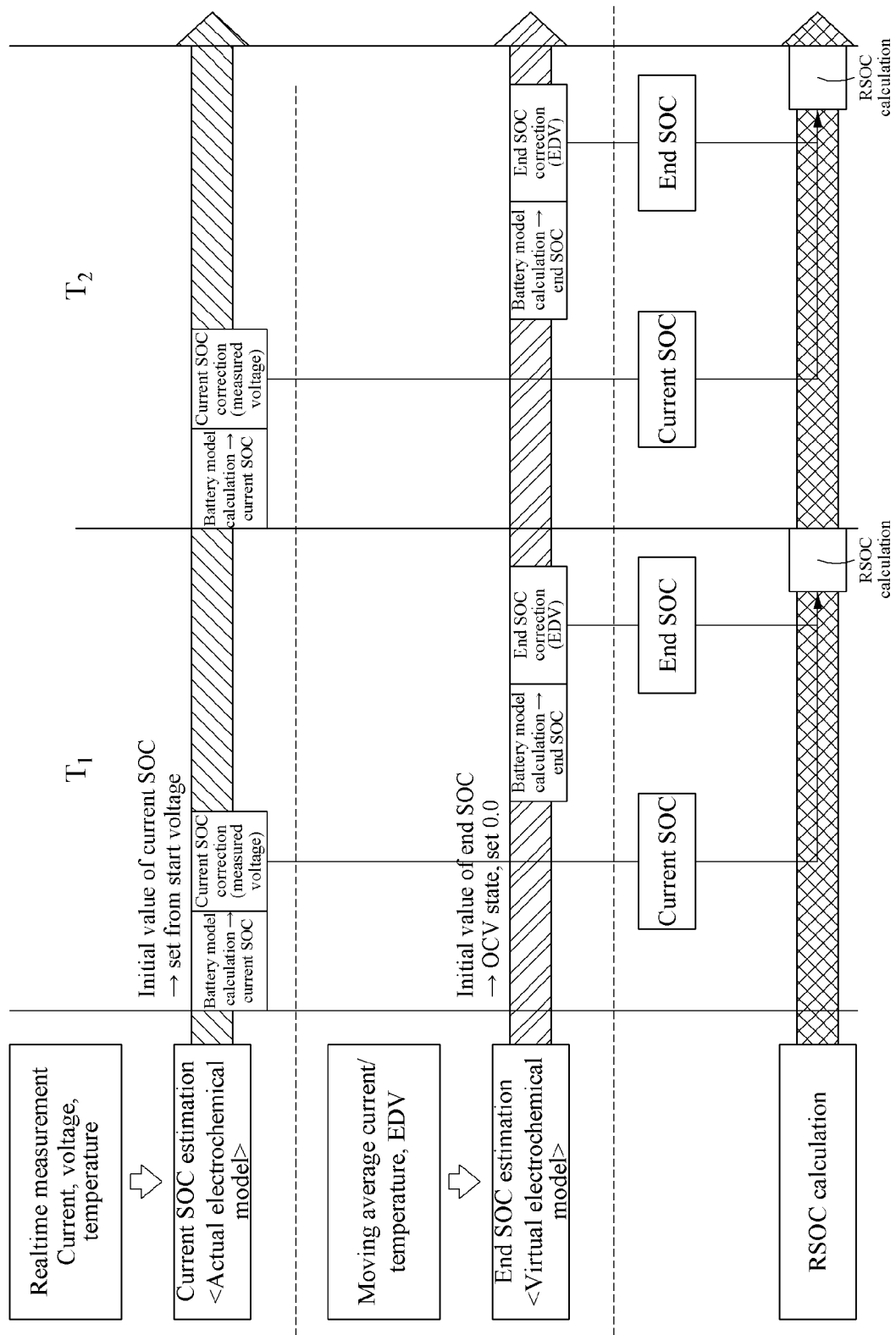
FIGS. 12 through 20 illustrate examples of estimating a relative state of charge (RSOC).

Referring to FIG. 12, a current SOC and an end SOC may be estimated in each period, and an RSOC may also be estimated based on these in each period. For example, one period may be hundreds of milliseconds (ms) to seconds (s). To obtain an RSOC, the following five steps—current SOC estimation in an actual electrochemical model, current SOC correction, end SOC estimation in a virtual electrochemical model, end SOC correction, and RSOC calculation—may be performed in sequential order as illustrated in FIG. 12. An amount of time used to perform such five steps may be an amount of time used to estimate an RSOC. For example, a current SOC may be estimated in the actual electrochemical model. In this example, an initial value of the current SOC in the actual electrochemical model may be set from a start voltage (e.g., FCC) of a battery. In addition, an end SOC may be estimated in the virtual electrochemical model. An initial value of the end SOC in the virtual electrochemical model may be in an OCV state, and thus be set from 0V.

Figure 13:
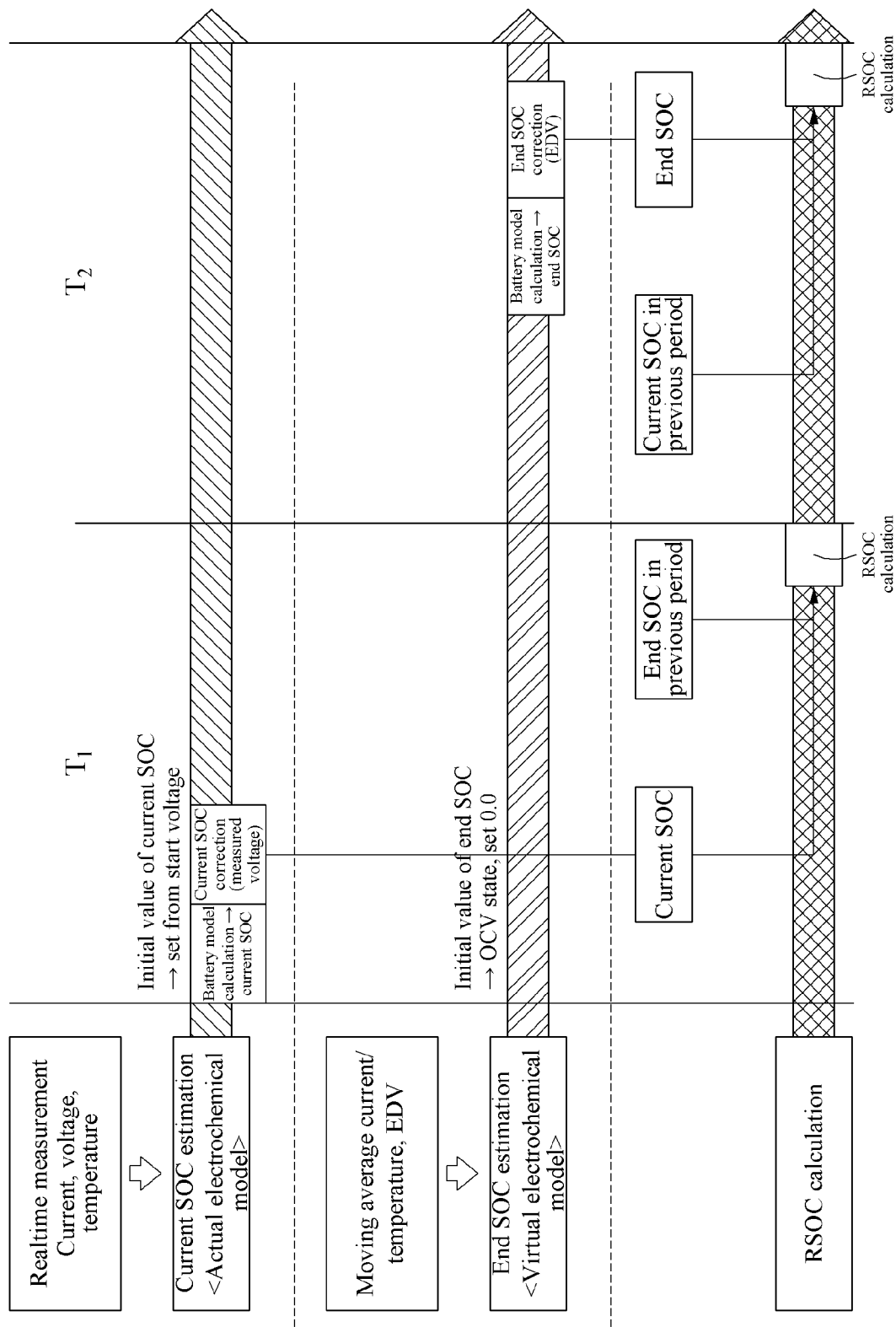

Referring to FIG. 13, a current SOC and an end SOC may not be calculated in one period, but calculated alternately in each period. For example, for an SOC that is not calculated in each period, a value calculated in a previous period may be used, and an RSOC may be calculated in each period using the value. Compared to the process performed as described above with reference to FIG. 12, an operation or computation time may be reduced by 50%.

Figure 14:
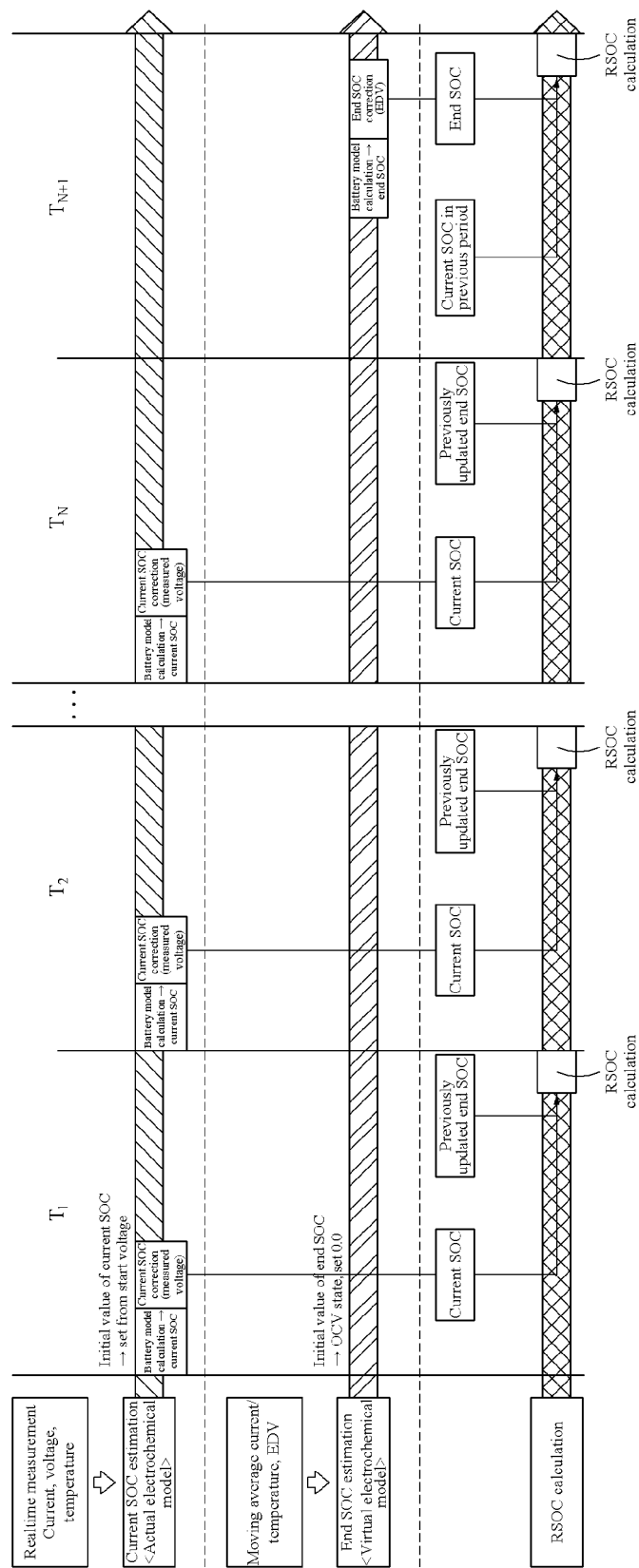

Referring to FIG. 14, using a characteristic that an end SOC changes more slowly than a current SOC, a current SOC may be calculated N times and then an end SOC may be calculated once, and the current SOC and the end SOC may be updated to calculate an RSOC in each period. Compared to the process performed as described above with reference to FIG. 12, an operation or computation time may be reduced by 50% while maintaining accuracy of the current SOC.

Figure 15:
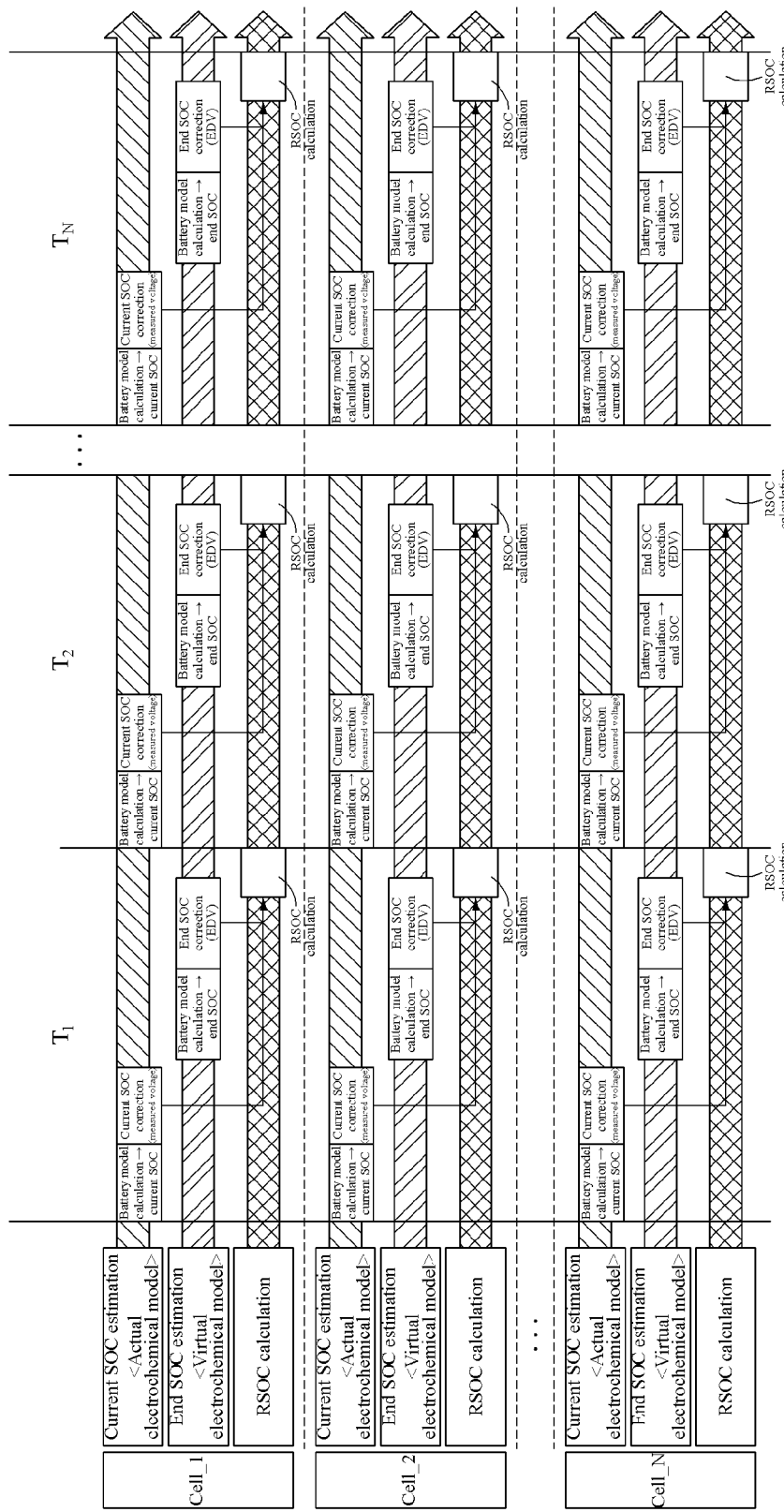

Referring to FIG. 15, in a case in which a plurality of batteries are included in a device, a current SOC and an end SOC may be calculated for each of the batteries in each period to calculate an RSOC in each period.

Figure 16:
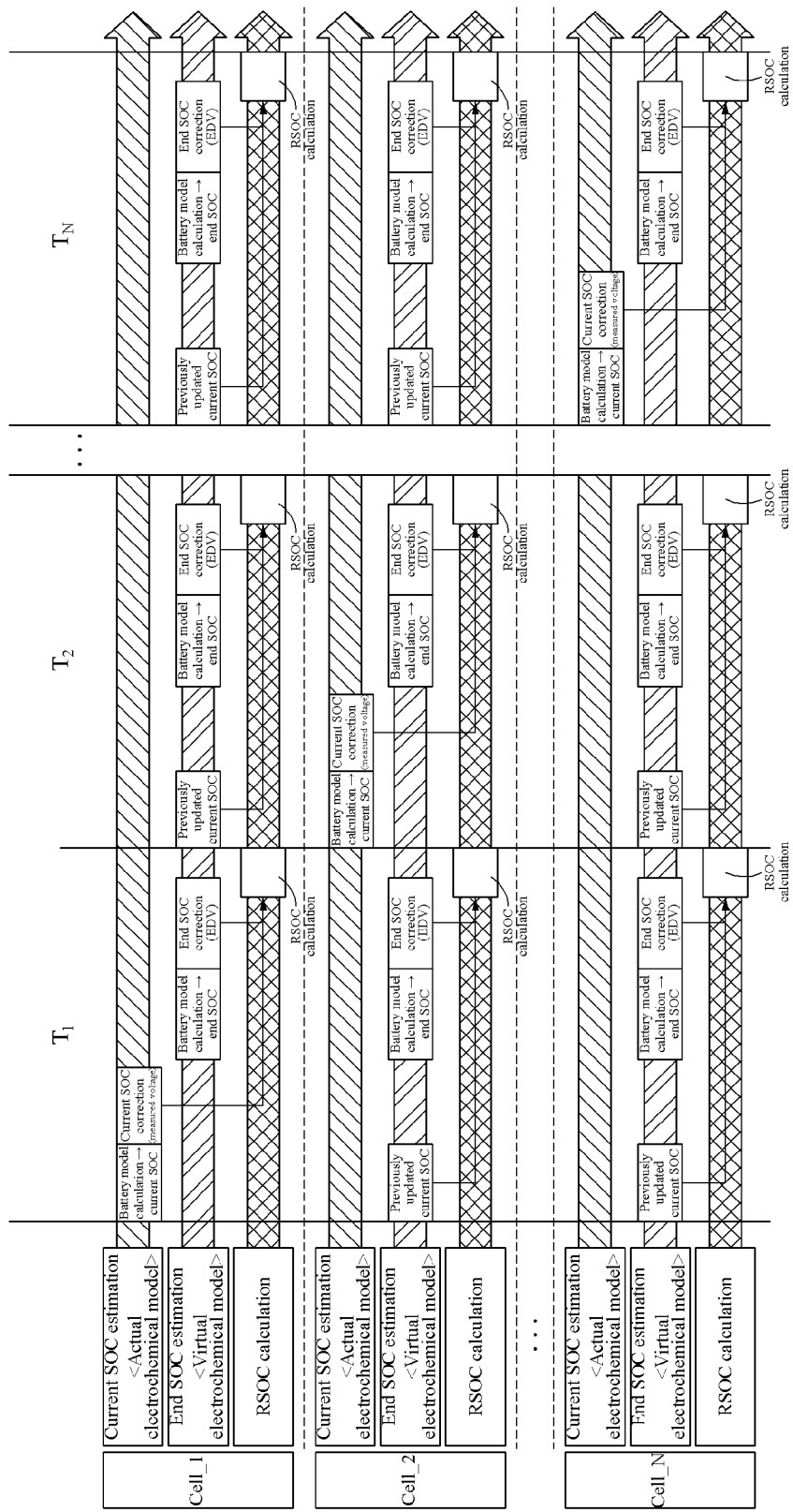

Referring to FIG. 16, an end SOC may be calculated for each of a plurality of batteries in each period, and a current SOC may be calculated for one of the batteries in one period. For the remaining batteries, a previously updated current SOC may be used to calculate an RSOC in each period. The current SOC calculation may be performed once and the end SOC calculation may be performed N times, in each period.

Figure 17:
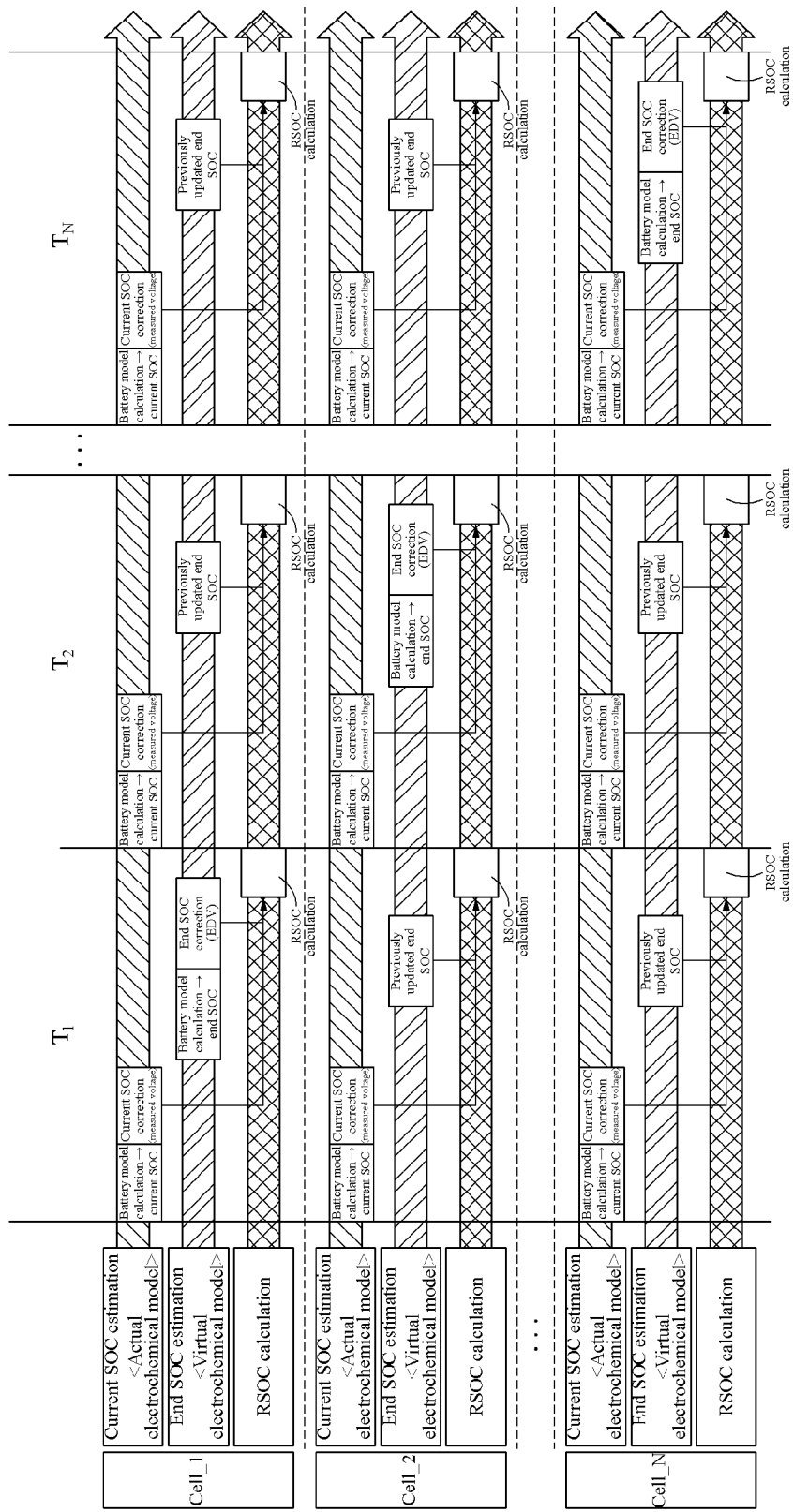

Referring to FIG. 17, a current SOC may be calculated for each of a plurality of batteries in each period, and an end SOC may be calculated for one of the batteries in one period. For the remaining batteries, a previously updated end SOC may be used to calculate an RSOC in each period. The current SOC calculation may be performed N times and the end SOC calculation may be performed once, in each period.

Figure 18:
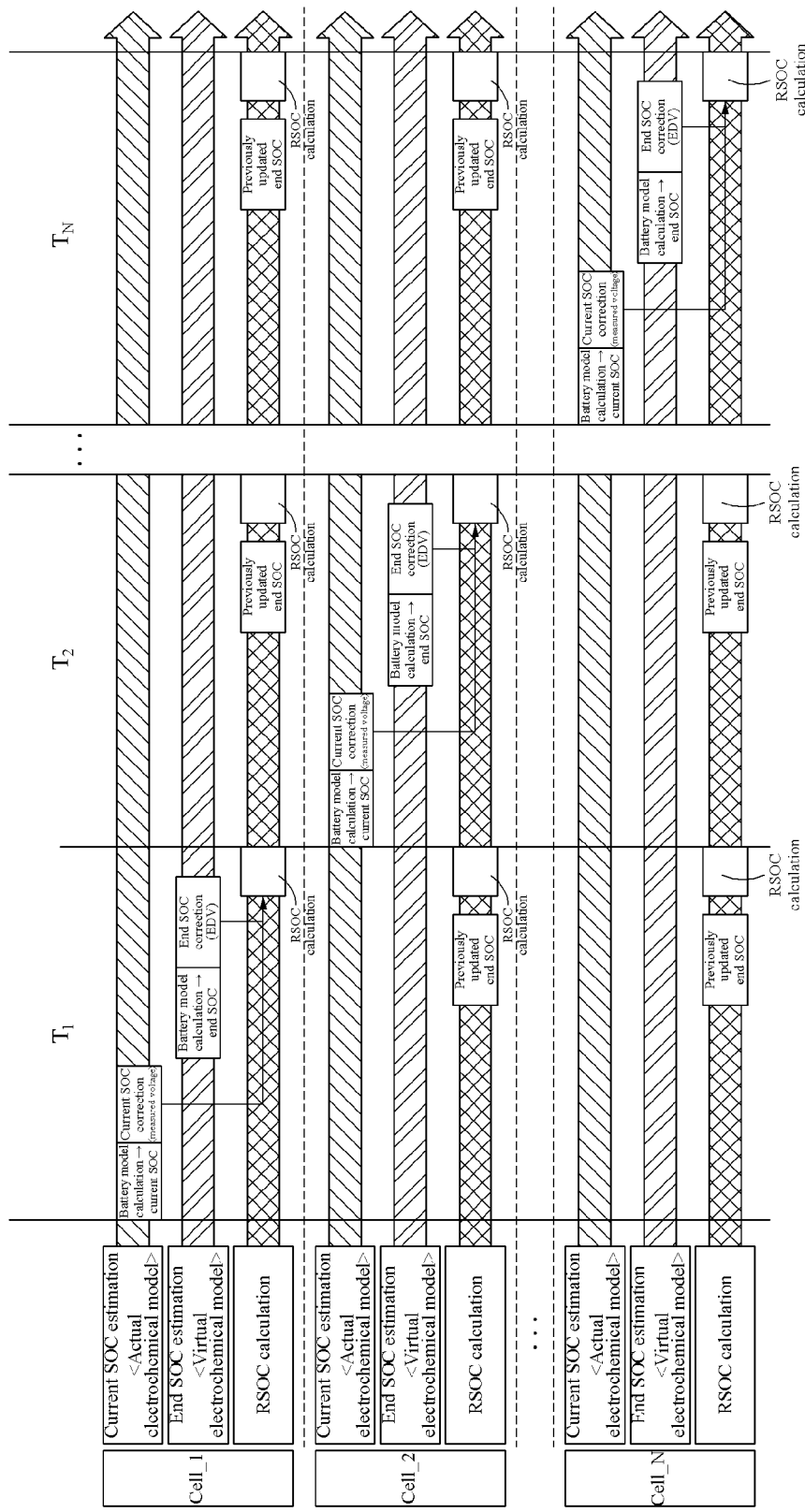

Referring to FIG. 18, a current SOC and an end SOC may be calculated for one of a plurality of batteries in one period, and an RSOC may be calculated for the battery. For the remaining batteries, a previously updated RSOC may be used. The current SOC calculation may be performed once and the end SOC calculation may be performed once, in each period.

Figure 19:
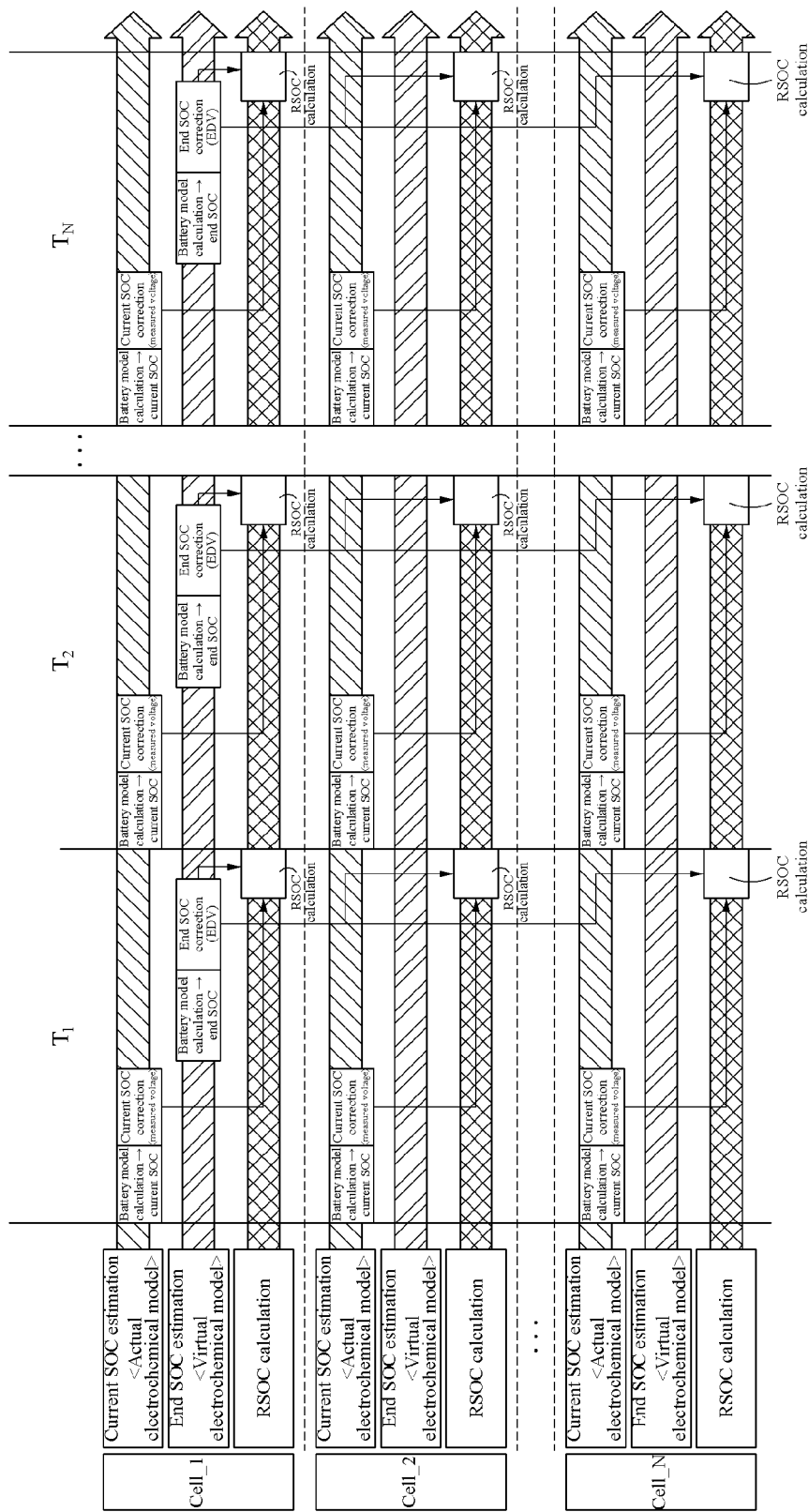

Referring to FIG. 19, a current SOC may be calculated for each of a plurality of batteries in each period and an end SOC may be calculated for a representative battery among the batteries in one period. For the remaining batteries, the end SOC of the representative battery may be used to calculate an RSOC in each period. The batteries may have a same cell characteristic, and thus an end SOC may not be significantly different for each battery. Thus, the end SOC may be calculated only for the representative battery. From among the batteries, a battery having an average current SOC (or end SOC) may be selected as the representative battery. The current SOC calculation may be performed N times and the end SOC calculation may be performed once, in each period.

Figure 20:
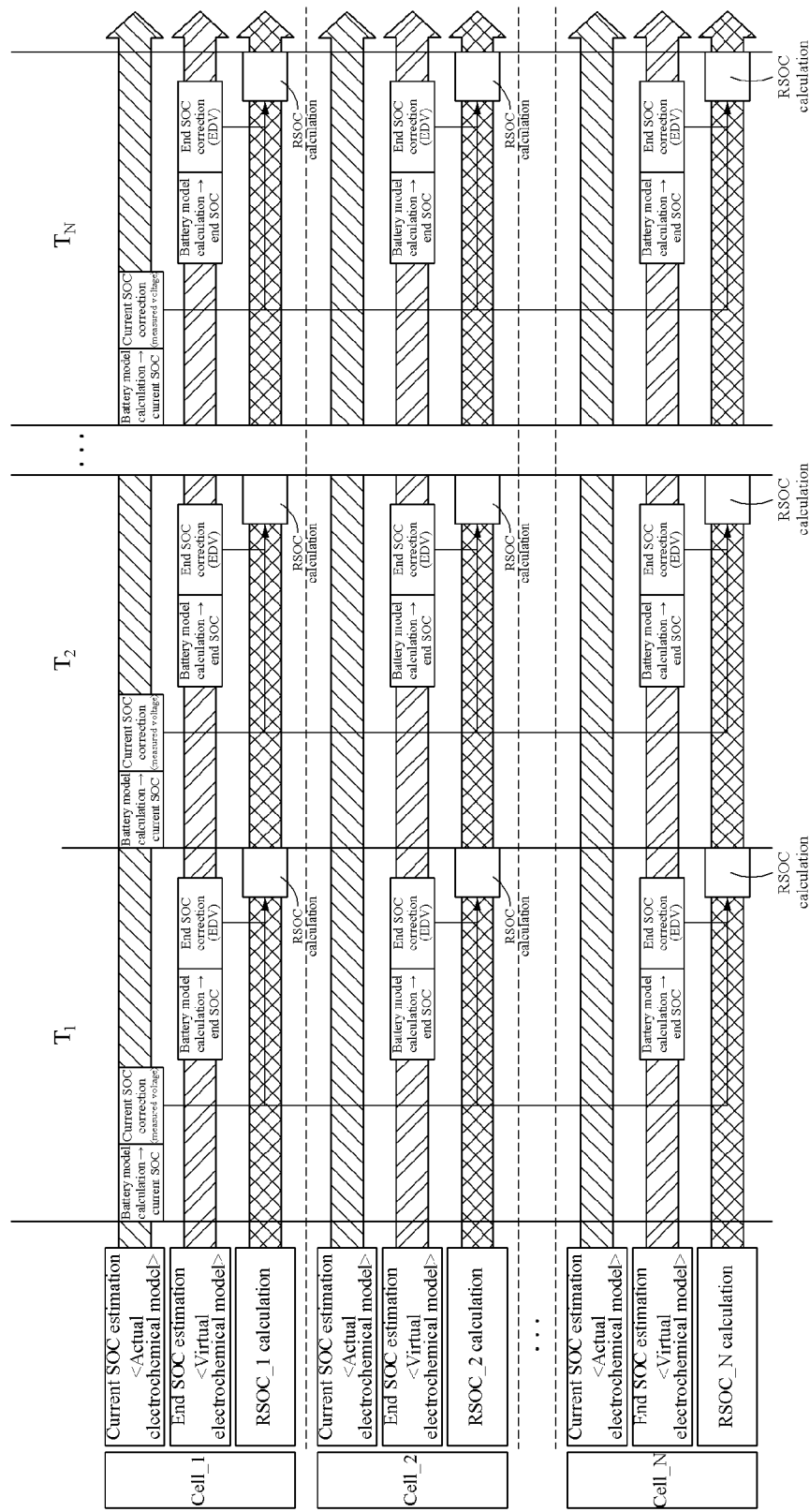

Referring to FIG. 20, in a single battery structure, a current SOC may be calculated once in each period and an end SOC may be calculated N times in each period to calculate an RSOC N times in each period. As described above, an end SOC may vary according to an applied current of a battery, and the applied current may vary according to an operation type of a device. In various cases, for example, playing music, playing a video, playing a game, and operating in an idle state, such processes described above may make it possible to calculate an available remaining time from a current battery state and provide a user with the calculated remaining time. The current SOC calculation may be performed once in each period and the end SOC calculation may be performed N times in each period.

Figure 21:
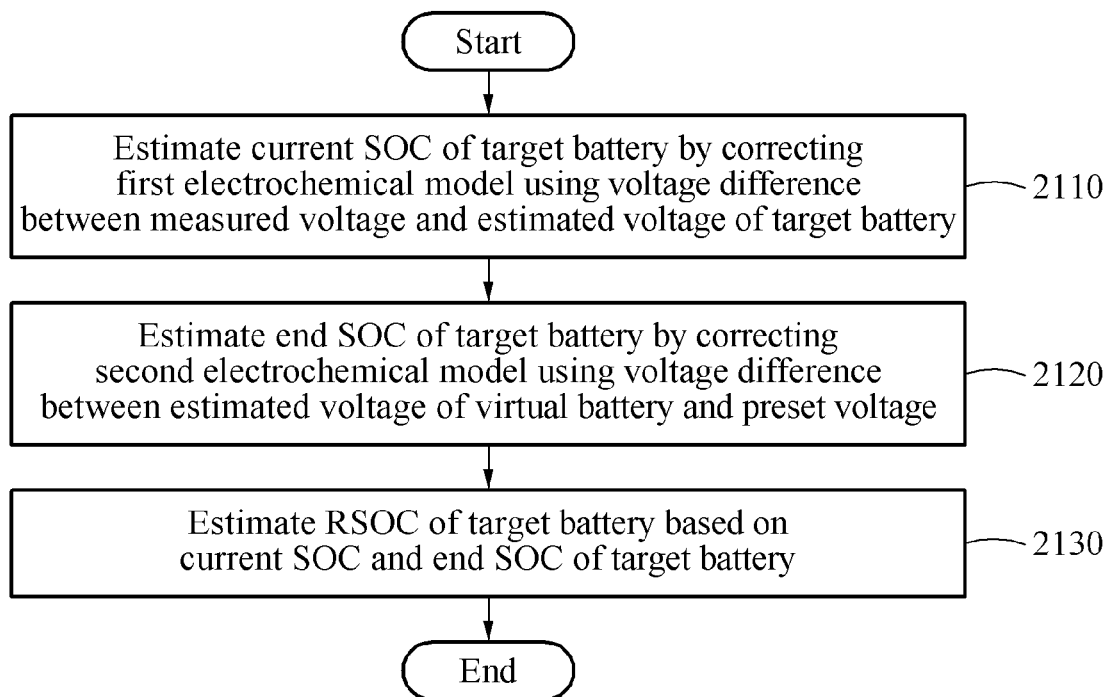
FIG. 21 illustrates an example of a battery state estimating method.

FIG. 21 illustrates an example of a battery state estimating method. FIG. 21 illustrates an example of a method of training a neural network to generate an image. The operations in FIG. 21 may be performed in the sequence and manner as shown, although the order of some operations may be changed or some of the operations omitted without departing from the spirit and scope of the illustrative examples described. Many of the operations shown in FIG. 21 may be performed in parallel or concurrently. One or more blocks of FIG. 21, and combinations of the blocks, can be implemented by special purpose hardware-based computer, such as a processor, that perform the specified functions, or combinations of special purpose hardware and computer instructions. In addition to the description of FIG. 21 below, the descriptions of FIGS. 1-20 are also applicable to FIG. 21, and are incorporated herein by reference. Thus, the above description may not be repeated here.

The battery state estimating method to be described hereinafter with reference to FIG. 21 may be performed by a processor included in a battery state estimating apparatus described herein.

Referring to FIG. 21, in operation 2110, the battery state estimating apparatus estimates a current SOC of a target battery by correcting a first electrochemical model corresponding to the target battery using a first voltage difference between a measured voltage of the target battery and an estimated voltage of the target battery that is estimated by the first electrochemical model. In operation 2120, the battery state estimating apparatus estimates an end SOC of the target battery by correcting a second electrochemical model using a voltage difference between an estimated voltage of a virtual battery that is estimated by the second electrochemical model and a preset voltage. The second electrochemical model may correspond to the virtual battery that indicates a virtual situation that the target battery is discharged to reach the preset voltage. In operation 2130, the battery state estimating apparatus estimates an RSOC of the target battery based on the current SOC and the end SOC of the target battery.

Figure 22:
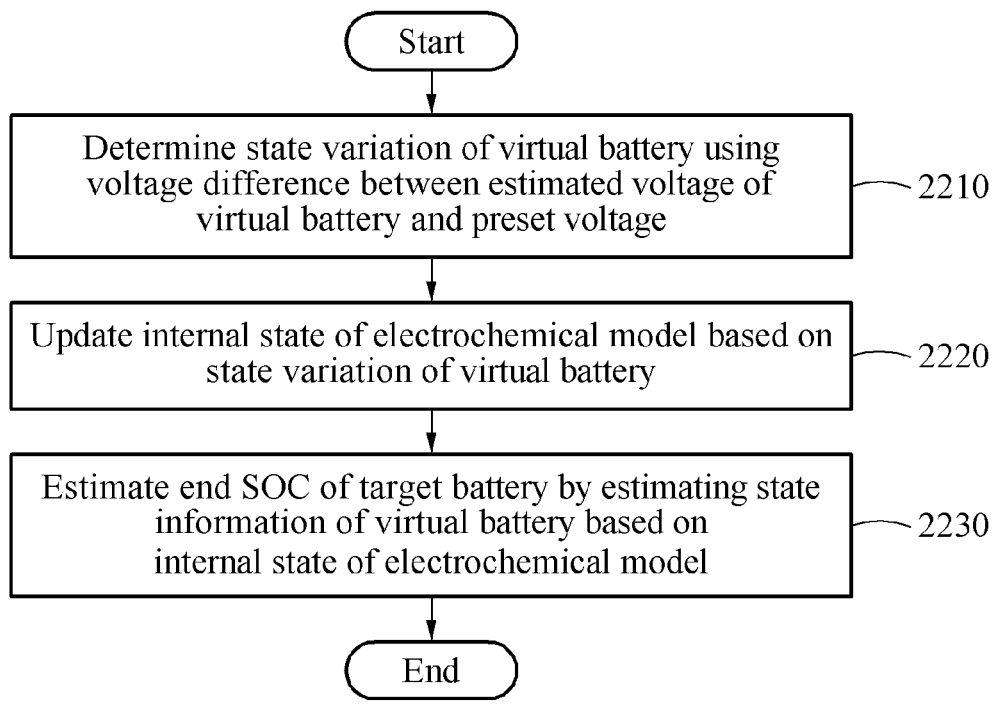
FIG. 22 illustrates an example of a battery state estimating method.

FIG. 22 illustrates an example of a battery state estimating method. FIG. 22 illustrates an example of a method of training a neural network to generate an image. The operations in FIG. 22 may be performed in the sequence and manner as shown, although the order of some operations may be changed or some of the operations omitted without departing from the spirit and scope of the illustrative examples described. Many of the operations shown in FIG. 22 may be performed in parallel or concurrently. One or more blocks of FIG. 22, and combinations of the blocks, can be implemented by special purpose hardware-based computer, such as a processor, that perform the specified functions, or combinations of special purpose hardware and computer instructions. In addition to the description of FIG. 22 below, the descriptions of FIGS. 1-21 are also applicable to FIG. 22, and are incorporated herein by reference. Thus, the above description may not be repeated here.

The battery state estimating method to be described hereinafter with reference to FIG. 22 may be performed by a processor included in a battery state estimating apparatus described herein.

Referring to FIG. 22, in operation 2210, the battery state estimating apparatus determines a state variation of a virtual battery, using a voltage difference between an estimated voltage of the virtual battery that is estimated by an electrochemical model corresponding to the virtual battery and a preset voltage. Here, the virtual battery may indicate a virtual situation assuming that a target battery is discharged to reach the preset voltage. In operation 2220, the battery state estimating apparatus updates an internal state of the electrochemical model based on the determined state variation of the virtual battery. In operation 2230, the battery state estimating apparatus estimates an end SOC of the target battery by estimating state information of the virtual battery based on the updated internal state of the electrochemical model.

Figure 23:
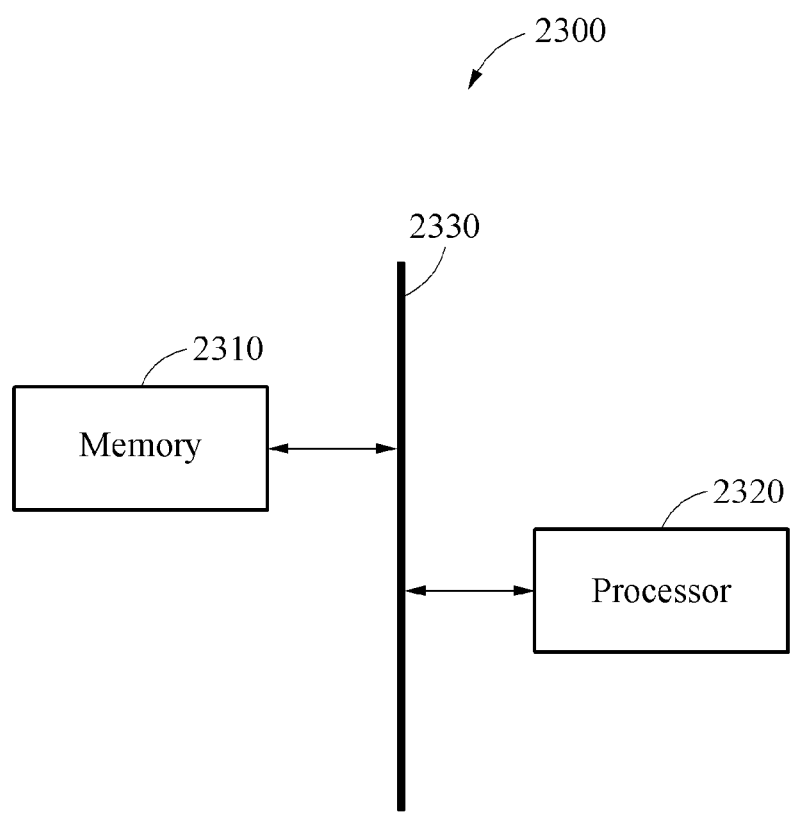
FIG. 23 illustrates an example of a battery state estimating apparatus.

FIG. 23 illustrates an example of a battery state estimating apparatus.

Referring to FIG. 23, a battery state estimating apparatus 2300 includes a memory 2310 and a processor 2320. The memory 2310 and the processor 2320 may communicate with each other through a bus 2330.

The memory 2310 may include computer-readable instructions. When an instruction stored in the memory 2310 is executed by the processor 2320, the processor 2320 may perform one or more, or all, of operations or methods described above. The memory 2310 may be a volatile or nonvolatile memory.

In an example, the volatile memory device may be, for example, a dynamic random-access memory (DRAM), a static RAM (SRAM), a thyristor RAM (T-RAM), a zero-capacitor RAM (Z-RAM), or a twin-transistor RAM (TTRAM).

In an example, the nonvolatile memory device may be, for example, an electrically erasable programmable read-only memory (EEPROM), a flash memory, a magnetic RAM (MRAM), a spin-transfer torque (STT) MRAM (STT-MRAM), a conductive bridging RAM (CBRAM), a ferroelectric RAM (FeRAM), a phase-change RAM (PRAM), a resistive RAM (RRAM), a nanotube RRAM, a polymer RAM (PoRAM), a nano-floating gate memory (NFGM), a holographic memory, a molecular electronic memory device, or an insulator resistance change memory. Further description of the memory 2310 is given below.

The processor 2320 may execute instructions or programs, or control the battery state estimating apparatus 2300. The processor 2320 may estimate a current SOC of a target battery by correcting a first electrochemical model using a voltage difference between a measured voltage of the target battery and an estimated voltage of the target battery that is estimated by the first electrochemical model. The processor 2320 may estimate an end SOC of the target battery by correcting a second electrochemical model using a voltage difference between an estimated voltage of a virtual battery that is estimated by the second electrochemical model and a preset voltage. The processor 2320 may then estimate an RSOC of the target battery based on the current SOC and the end SOC of the target battery.

In an example, the battery state estimating apparatus 2300 may be applied to a battery management system (BMS) having a function of estimating an SOC of a secondary battery, an electronic device using a secondary battery, a means of transportation using a secondary battery, a secondary battery-based power storage device, and the like. In addition, the battery state estimating apparatus 2300 may be provided in a low-specification device, such as, for example, a power management integrated circuit (PMIC), by effectively reducing an amount of time used for calculating an end SOC of a battery using a virtual battery model-based end SOC estimating method. The battery state estimating apparatus 2300 may also be applied to quick charging based on internal state information of an electrochemical model, automatic degradation update based on an electrochemical model, prediction of an internal short circuit of a battery, fuel gauging of a battery, and the like.

The battery state estimating apparatus 2300 may be applied to various computing devices (e.g., smartphone, tablet, laptop, PC, etc.), various wearable devices (e.g., smart watch, smart eyeglasses, etc.), various home appliances (e.g., smart speaker, smart TV, smart refrigerator, etc.), and other smart devices such as a smart vehicle, a robot, a drone, a walking assist device (WAD), an Internet of thins (IoT) device, and the like.

In addition to the foregoing, the battery state estimating apparatus 2300 may perform operations described herein.

Figure 24:
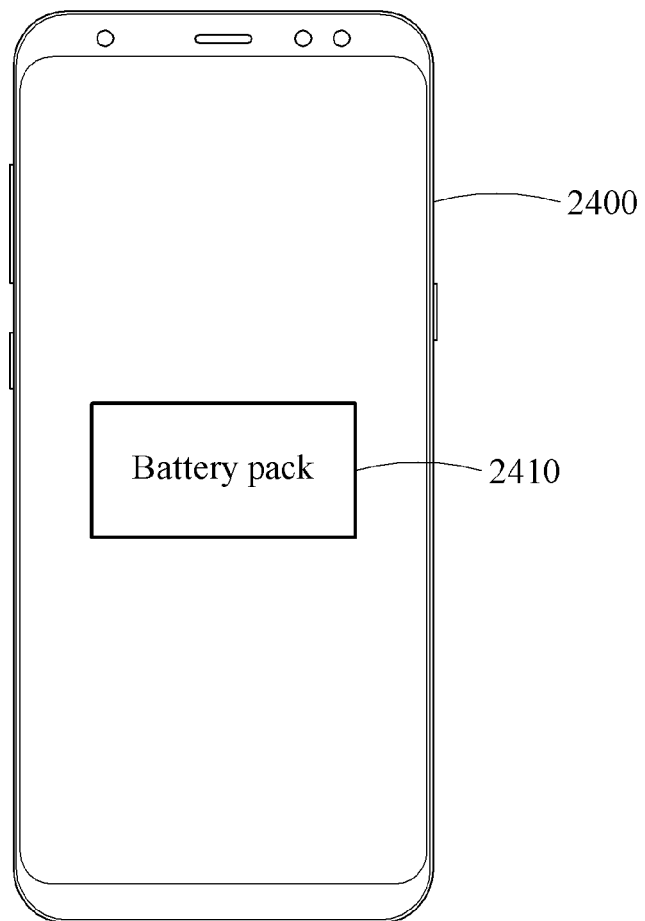
FIG. 24 illustrates an example of a mobile device incorporating the battery state estimating apparatus.

FIG. 24 illustrates an example of a mobile device embodiment.

Referring to FIG. 24, a mobile device 2400 includes a battery pack 2410. The mobile device 2400 may use the battery pack 2410 as a power source. The mobile device 2400 may be a portable terminal such as a smartphone. FIG. 24 illustrates the mobile device 2400 as a smartphone as an example for the convenience of description. However, the mobile device 2400 may be other terminals, for example, a laptop computer, a tablet PC, a wearable device, and the like. The battery pack 2410 may include a BMS and battery cells (or battery modules).

In an example, the mobile device 2400 may include a battery state estimating apparatus described above. The battery state estimating apparatus may estimate an RSOC of the battery pack 2410 based on a current SOC and an end SOC of the battery pack 2410 (or the battery cells in the battery pack 2410).

For a more detailed description of example features and operations of the mobile device 2400, reference may be made to the descriptions provided above with reference to FIGS. 1 through 23 and a more detailed and repeated description will be omitted here for brevity.

Figure 25:
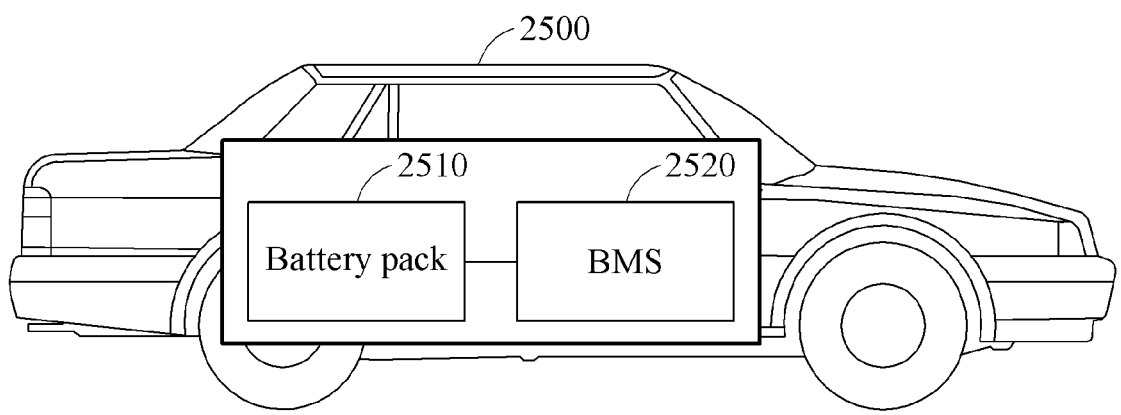
FIGS. 25 and 26 illustrate an example of a vehicle incorporating the battery state estimating apparatus.
Figure 26:
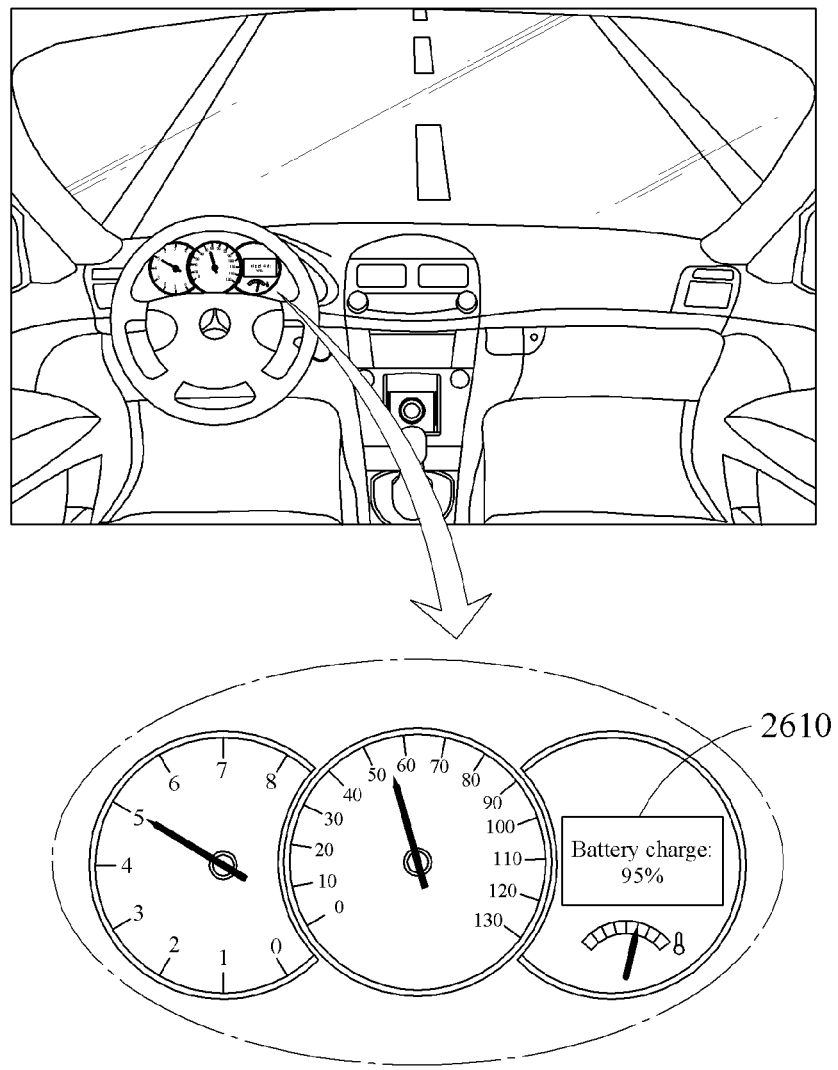

FIGS. 25 and 26 illustrate an example of a vehicle embodiment.

Referring to FIG. 25, a vehicle 2500 includes a battery pack 2510 and a BMS 2520. The vehicle 2500 may use the battery pack 2510 as a power source. The vehicle 2500 may be an electric vehicle or a hybrid vehicle, for example.

The battery pack 2510 may include a plurality of battery modules each including a plurality of battery cells.

The BMS 2520 may monitor whether an abnormality occurs in the battery pack 2510, and prevent the battery pack 2510 from being over-charged or over-discharged. In addition, when a temperature of the battery pack 2510 exceeds a first temperature, for example, 40° C. or is less than a second temperature, for example, −10° C., the BMS 2520 may perform thermal control on the battery pack 2510. In addition, the BMS 2520 may perform cell balancing to equalize charging states of the battery cells included in the battery pack 2510.

In an example, the BMS 2520 may include a battery state estimating apparatus described above, and determine state information of each of the battery cells included in the battery pack 2510 or state information of the battery pack 2510 using the battery state estimating apparatus. The BMS 2520 may determine, to be the state information of the battery pack 2510, a maximum value, a minimum value, or an average value of the state information the battery cells.

The BMS 2520 may transmit the state information of the battery pack 2510 to an electronic control unit (ECU) or a vehicle control unit (VCU) of the vehicle 2500. The ECU or the VCU of the vehicle 2500 may output the state information of the battery pack 2510 onto a display of the vehicle 2500. As illustrated in FIG. 26, the ECU or the VCU may display the state information of the battery pack 2510 on a dashboard 2610 of the vehicle 2500. In another example, the ECU or the VCU may display, on the dashboard 2610, a remaining available travel distance determined based on the estimated state information. In another example, the ECU or the VCU may display the state information, the remaining available travel distance, and the like on a head-up display of the vehicle 2500.

For a more detailed description of example features and operations of the vehicle 2500, reference may be made to the descriptions provided above with reference to FIGS. 1 through 23 and a more detailed and repeated description will be omitted here for brevity.

The battery state estimating apparatus, battery state estimating apparatus 120, battery state estimating apparatus 2300, BMS 2520, and other apparatuses, units, modules, devices, and components described herein with respect to FIGS. 1, 23, 24, 25, and 26 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIM D) multiprocessing, multiple-instruction single-data (MISD) multiprocessing, multiple-instruction multiple-data (MIMD) multiprocessing, a controller and an arithmetic logic unit (ALU), a DSP, a microcomputer, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner.

The methods illustrated in FIGS. 1-26 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In an example, the instructions or software includes at least one of an applet, a dynamic link library (DLL), middleware, firmware, a device driver, an application program storing the method of battery state estimation. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples a non-transitory computer-readable storage medium include read-only memory (ROM), random-access programmable read only memory (PROM), electrically erasable programmable read-only memory (EEPROM), random-access memory (RAM), magnetic RAM (MRAM), spin-transfer torque (STT)-MRAM, static random-access memory (SRAM), thyristor RAM (T-RAM), zero capacitor RAM (Z-RAM), twin transistor RAM (TTRAM), conductive bridging RAM (CBRAM), ferroelectric RAM (FeRAM), phase change RAM (PRAM), resistive RAM (RRAM), nanotube RRAM, polymer RAM (PoRAM), nano floating gate Memory (NFGM), holographic memory, molecular electronic memory device), insulator resistance change memory, dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A processor-implemented method for battery state estimation, comprising:

correcting a first electrochemical model corresponding to a target battery using a first voltage difference between a measured voltage of the target battery and an estimated voltage of the target battery that is estimated by the first electrochemical model;

estimating, using the corrected first electrochemical model, a current state of charge (SOC) of the target battery;

correcting a second electrochemical model using a second voltage difference between an estimated voltage of a virtual battery that is estimated by the second electrochemical model and a preset voltage;

estimating, using the corrected second electrochemical model, an end SOC of the target battery; and estimating a relative SOC (RSOC) of the target battery based on the current SOC and the end SOC of the target battery, wherein the second electrochemical model is based on the virtual battery corresponding to the target battery being discharged to reach the preset voltage.

2. The method of claim 1, wherein the estimating of the end SOC comprises:

estimating a current SOC of the virtual battery using the second electrochemical model updated, in response to the estimated voltage of the virtual battery corresponding to the preset voltage; and determining the current SOC of the virtual battery to be the end SOC of the target battery.

3. The method of claim 1, wherein the first electrochemical model and the second electrochemical model have a same physical property parameter and different internal state information.

4. The method of claim 1, wherein the end SOC is an SOC obtained as the target battery is discharged by a current output from the target battery and reaches the preset voltage.

5. The method of claim 1, wherein the estimating of the end SOC comprises:

determining a state variation of the virtual battery using the second voltage difference;

updating an internal state of the second electrochemical model based on the determined state variation of the virtual battery; and estimating state information of the virtual battery based on the updated internal state of the second electrochemical model.

6. The method of claim 5, wherein the state variation of the virtual battery is based on the second voltage difference, previous state information estimated by the second electrochemical model, and an open-circuit voltage (OCV) table.

7. The method of claim 6, wherein the state variation of the virtual battery is determined by obtaining an OCV corresponding to the previous state information based on the OCV table, and applying the second voltage difference to the obtained OCV.

8. The method of claim 5, wherein the internal state of the second electrochemical model is updated by correcting an ion concentration distribution in an active material particle or an ion concentration distribution in an electrode based on the state variation of the virtual battery.

9. The method of claim 5, wherein the internal state of the second electrochemical model comprises at least one of a positive electrode lithium ion concentration distribution, a negative electrode lithium ion concentration distribution, or an electrolyte lithium ion concentration distribution of the virtual battery.

10. The method of claim 1, wherein the estimating of the RSOC comprises:

estimating the RSOC based on one of the current SOC and the end SOC that is estimated in a current period, and the other one of the current SOC and an end SOC estimated in a previous period.

11. The method of claim 1, wherein the estimating of the end SOC is performed after the estimating of the current SOC is performed for a number of times.

12. The method of claim 1, wherein:
the target battery comprises a plurality of batteries;
the estimating of the current SOC is performed on each of the plurality of batteries, and the estimating of the end SOC is performed on a representative battery from among the plurality of batteries,
wherein the estimating of the RSOC comprises:
estimating an RSOC of each of the plurality of batteries based on a current SOC estimated from each of the plurality of batteries and an end SOC estimated from the representative battery.

13. The method of claim 1, wherein the estimating of the end SOC comprises:
estimating a plurality of end SOCs using a plurality of virtual batteries indicating a virtual situation that the target battery is discharged by different currents to reach the preset voltage,
wherein the estimating of the RSOC comprises:
estimating a plurality of RSOCs of the target battery based on the current SOC of the target battery and the estimated end SOCs.

14. The method of claim 1, wherein the preset voltage is an end-of-discharge voltage (EDV) of the target battery.

15. The method of claim 1, wherein the target battery is a battery cell, a battery module, or a battery pack.

16. A non-transitory computer-readable storage medium storing instructions that, when executed by a processor, cause the processor to perform the method of claim 1.

17. An apparatus with battery state estimation, comprising:
a memory configured to store a first electrochemical model corresponding to a target battery and a second electrochemical model based on a virtual battery corresponding to the target battery being discharged to reach a preset voltage; and
a processor configured to:

correct the first electrochemical model using a voltage difference between a measured voltage of a target battery and an estimated voltage of the target battery that is estimated by the first electrochemical model;
estimate, using the corrected first electrochemical model, a current state of charge (SOC) of the target battery;
correct the second electrochemical model using a voltage difference between an estimated voltage of the virtual battery that is estimated by the second electrochemical model and the preset voltage;
estimate, using the corrected second electrochemical model, an end SOC of the target battery by correcting and
estimate the RSOC of the target battery based on the current SOC and the end SOC of the target battery.

18. A processor-implemented method for battery state estimation, comprising:
determining a state variation of a virtual battery corresponding to a target battery that is discharged to reach a preset voltage, using a voltage difference between an estimated voltage that is estimated by an electrochemical model corresponding to the virtual battery and a preset voltage;
updating an internal state of the electrochemical model based on the determined state variation of the virtual battery; and
estimating, using the updated internal state of the electrochemical model, an end state of charge (SOC) of the target battery by estimating state information of the virtual battery.

19. The method of claim 18, wherein the determining of the state variation of the virtual battery comprises:
determining the state variation of the virtual battery based on the voltage difference, previous state information estimated by the electrochemical model, and an open-circuit voltage (OCV) table.

20. The method of claim 18, wherein the updating of the internal state of the electrochemical model comprises:
updating the internal state of the electrochemical model by correcting an ion concentration distribution in an active material particle or an ion concentration distribution in an electrode based on the state variation of the virtual battery.

* * * * *